United States Patent
Lee et al.

(10) Patent No.: US 7,630,208 B2
(45) Date of Patent: Dec. 8, 2009

(54) MULTILAYER CHIP CAPACITOR, CIRCUIT BOARD APPARATUS HAVING THE CAPACITOR, AND CIRCUIT BOARD

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunngi-Do (KR)

( * ) Notice: Subject to any disclaimer, the term of this patent is extended or adjusted under 35 U.S.C. 154(b) by 0 days.

(21) Appl. No.: 12/198,342

(22) Filed: Aug. 26, 2008

(65) Prior Publication Data

US 2009/0059469 A1    Mar. 5, 2009

(30) Foreign Application Priority Data

Aug. 31, 2007    (KR) ...................... 10-2007-0088544

(51) Int. Cl.
    *H05K 1/16*    (2006.01)
(52) U.S. Cl. .................... 361/766; 361/301.3; 361/303; 361/306.3; 361/311
(58) Field of Classification Search ......... 361/760–766, 361/301.1–301.4, 303, 306.3, 311, 792–795; 174/260, 261
    See application file for complete search history.

(56) References Cited

U.S. PATENT DOCUMENTS

| | | | |
|---|---|---|---|
| 5,880,925 A | | 3/1999 | DuPre et al. |
| 6,327,134 B1 * | | 12/2001 | Kuroda et al. ............... 361/303 |
| 6,452,781 B1 * | | 9/2002 | Ahiko et al. ............. 361/321.2 |
| 6,606,237 B1 * | | 8/2003 | Naito et al. .............. 361/306.3 |
| 7,092,236 B2 * | | 8/2006 | Lee et al. ..................... 361/311 |
| 7,428,135 B2 * | | 9/2008 | Togashi et al. ............. 361/303 |
| 2006/0209492 A1 | | 9/2006 | Togashi |
| 2007/0279836 A1 * | | 12/2007 | Takashima et al. ....... 361/306.3 |
| 2008/0204969 A1 | | 8/2008 | Takashima et al. |

FOREIGN PATENT DOCUMENTS

| | | |
|---|---|---|
| JP | 2007-142295 | 6/2007 |
| KR | 10-2007-0002654 | 1/2007 |

OTHER PUBLICATIONS

Korean Office Action issued in Korean Patent Application No. KR 10-2007-0088544, mailed Dec. 16, 2008.

* cited by examiner

*Primary Examiner*—Dean A. Reichard
*Assistant Examiner*—Xiaoliang Chen
(74) *Attorney, Agent, or Firm*—McDermott Will & Emery LLP

(57) ABSTRACT

Provided is a multilayer chip capacitor including a capacitor body having first and second capacitor units arranged in a lamination direction; and a plurality of external electrodes formed outside the capacitor body. The first capacitor unit includes at least one pair of first and second internal electrodes disposed alternately in an inner part of the capacitor body, the second capacitor unit includes a plurality of third and fourth internal electrodes disposed alternately in an inner part of the capacitor body, and the first to fourth internal electrodes are coupled to the first to fourth external electrodes. The first capacitor unit has a lower equivalent series inductance (ESL) than the second capacitor unit, and the first capacitor unit has a higher equivalent series resistance (ESR) than the second capacitor unit.

47 Claims, 22 Drawing Sheets

MULTILAYER CHIP CAPACITOR, CIRCUIT BOARD APPARATUS HAVING THE CAPACITOR, AND CIRCUIT BOARD

CROSS-REFERENCE TO RELATED APPLICATIONS

This application claims the priority of Korean Patent Application No. 2007-88544 filed on Aug. 31, 2007, in the Korean Intellectual Property Office, the disclosure of which is incorporated herein by reference.

BACKGROUND OF THE INVENTION

1. Field of the Invention

The present invention relates to a multilayer chip capacitor, and more particularly, to a multilayer chip capacitor that includes a plurality of capacitor units in a unitary structure and has a low equivalent series inductance (ESL) and a high series resistance (ESR) which can be controlled within the broadband frequency range, a circuit board apparatus having the multilayer chip capacitor, and a circuit board for mounting the multilayer chip capacitor.

2. Description of the Related Art

A multilayer chip capacitor has been widely used as a decoupling capacitor for the stabilization of power circuits such as a power distribution network of a micro processing unit (MPU). The multilayer chip capacitor used for the decoupling purpose functions to suppress voltage noise by supplying an electric current to CPU chips when the applied current are changed rapidly.

In general, the MPU is continuously increased in current consumption and decreased in operation voltage as its integration density increases. Also, its operation speed is continuously increased. Accordingly, it is increasingly difficult to suppress noise of a supply DC voltage within a certain range since the noise is generated by the sudden change in the consumed current of the MPU. Recently, an applied current is changed more rapidly with the increase in an operating frequency of the MPU. Therefore there is required a multilayer chip capacitor capable of increasing the capacitance and ESR of a decoupling capacitor and decreasing ESL of the decoupling capacitor. This is merely designed to maintain impedance of a power distribution network to a constant level within the broadband frequency range, and ultimately prevent noise of the supply DC voltage by the sudden change of the applied current.

In order to meet low ESL characteristics required for the decoupling capacitor used in the MPU power distribution network, there have been proposed methods of modifying the position, form or shape of the external and internal electrodes in a capacitor. For example, U.S. Pat. No. 5,880,925 proposes a plan to reduce ESL by disposing leads of first and second internal electrodes of different polarities in an interdigitated arrangement, while the first internal electrodes and the second internal electrodes are adjacent to each other, thereby to form current paths in the capacitor effectively. This prior-art method leads to a decrease in ESL but may, disadvantageously, entail a reduction in ESR besides the ESL. Stability of the power circuit depends on the ERS as well as the ESL of the capacitor. Therefore, the power circuit becomes unstable when the ESR is too low, and the voltage may be changed suddenly due to power network resonance. Accordingly, the capacitor as described in the US patent is effective to reduce high frequency impedance, but hardly maintains the impedance of the power distribution network to a constant level due to very low ESR.

In order to solve the problem associated with very low ESR, there has been proposed a plan for realizing high ESR characteristics using electrically high-resistant materials in the external electrodes and internal electrodes. However, the use of the high-resistant external electrodes has some difficulty in preventing localized heat spots caused by current channeling phenomenon through pinholes in the external electrodes, which also makes it difficult to control ESR precisely. Also, when the high-resistance materials are used in the internal electrodes, the problem is that high-resistant internal electrode materials should be changed with the improvement or changes of ceramic materials since the high-resistant internal electrode materials should be matched with ceramic materials, which leads to the increased cost of the products.

US Patent Publication No. 2006/0209492 proposes a capacitor having low impedance in a wide frequency band by integrally disposing two capacitors of different capacitances in the same capacitor body. However, the capacitor does not maintain the power network impedance to a constant level (in the vicinity of each resonance frequency), as described in the patent publication, and therefore the constant impedance of the power network adversely affects the stability of a power circuit.

SUMMARY OF THE INVENTION

An aspect of the present invention provides a multilayer chip capacitor capable of meeting both characteristics of low equivalent series inductance (ESL) and high equivalent series resistance (ESR) without any change of materials thereof.

An aspect of the present invention also provides a circuit board apparatus having the multilayer chip capacitor capable of meeting both characteristics of low ESL and high ESR without any change of materials thereof.

An aspect of the present invention also provides a circuit board in which the multilayer chip capacitor is mounted.

According to an aspect of the present invention, there is provided a multilayer chip capacitor including a capacitor body having a multilayer structure where a plurality of dielectric layers are stacked, and a plurality of external electrodes formed on one side surface of the capacitor body, wherein the capacitor body includes a first capacitor unit and a second capacitor unit, both of which are arranged along a lamination direction, wherein the first capacitor unit includes at least a pair of first and second internal electrodes (the first and second internal electrodes have different polarities), all of which are alternately disposed in the inside of the capacitor body to face each other while being isolated in the dielectric layers, wherein the second capacitor unit includes a plurality of third and fourth internal electrodes (the third and fourth internal electrodes have different polarities), all of which are alternately disposed in the inside of the capacitor body to face each other while being isolated in the dielectric layers, wherein a plurality of the external electrodes include at least one first external electrode coupled to the first internal electrode, at least one second external electrode coupled to the second internal electrode, at least one third external electrode coupled to the third internal electrode, and at least one fourth external electrode coupled to the fourth internal electrode, and wherein the first capacitor unit has a lower equivalent series inductance (ESL) than the second capacitor unit, and the first capacitor unit has a higher equivalent series resistance (ESR) than the second capacitor unit.

The first capacitor unit may be disposed in at least one end thereof in the lamination direction. The two the first capacitor units may be disposed in both ends (namely, an upper portion and a lower portion) of the multilayer chip capacitor in the lamination direction, and the second capacitor unit may be disposed between the two first capacitor units. In particular, the multilayer chip capacitor may have upper and lower symmetry by symmetrically disposing two first capacitor units disposed in the both ends of the multilayer chip capacitor.

The total number of the stacked third and fourth internal electrodes in the second capacitor unit may be higher than that of the stacked first and second internal electrodes in the first capacitor unit. The first capacitor unit and the second capacitor unit may be electrically isolated in the multilayer chip capacitor.

The first and second external electrodes may be disposed in the facing first and second side surfaces of the capacitor body, and the first and second internal electrodes may be coupled respectively to the first and second external electrodes through leads. Also, the third and fourth external electrodes may be disposed in two another facing side surfaces of the capacitor body. In this case, the multilayer chip capacitor may be a 4-terminal capacitor including one first external electrode, one second external electrode, one third external electrode and one fourth external electrode. In order to shorten a current path between the first and second external electrodes, a distance between the first and second side surfaces may be smaller than that between the third and fourth side surfaces.

A plurality of the first and second external electrodes may be alternately disposed in the facing first and second side surfaces of the capacitor body, and the first and second internal electrodes may be coupled respectively to the first and second external electrodes through leads. Also, the third and fourth external electrodes may be disposed in another two facing side surfaces of the capacitor body.

In particular, the first and second internal electrodes may be coupled respectively to the first and second external electrodes through two leads in the case of the first capacitor unit. Also, the third and fourth internal electrodes may be coupled respectively to the third and fourth external electrodes through one lead in the case of the second capacitor unit. In this case, the multilayer chip capacitor may be a 10-terminal capacitor including 4 first external electrodes, 4 second external electrodes, one third external electrode and one fourth external electrode.

The internal electrodes having the same polarity in the first capacitor unit may be all electrically coupled to the external electrodes having the same polarity in the first and second external electrodes. Also, the leads in the internal electrodes having different polarities, which are disposed adjacent to each other in a lamination direction, may be disposed in the first capacitor unit to be always adjacent to each other when viewed in the lamination direction.

The first and second external electrodes may be disposed in the facing first and second side surfaces of the capacitor body, and the first and second internal electrodes may be coupled respectively to the first and second external electrodes through leads. Also, the third and fourth external electrodes may be disposed in the first and second side surfaces, and the third and fourth internal electrodes may be coupled to the third and fourth external electrodes through leads.

In particular, the first and second internal electrodes may be coupled respectively to the first and second external electrodes through two leads in the case of the first capacitor unit, and the third and fourth internal electrodes may be coupled respectively to the third and fourth external electrodes through one lead in the case of the second capacitor unit.

According to still another aspect of the present invention, there is provided a circuit board apparatus including the multilayer chip capacitor according to one aspect of the present invention; and a circuit board including a mounting surface having the multilayer chip capacitor mounted therein and an external circuit electrically coupled to the multilayer chip capacitor. A plurality of mounting pads coupled to external electrodes of the multilayer chip capacitor are formed on the mounting surface of the circuit board. The multilayer chip capacitor is disposed so that the first capacitor unit can be positioned more adjacently to the mounting surface than the second capacitor unit.

A plurality of the mounting pads include a first pad coupled to the first external electrode, a second pad coupled to the second external electrode, a third pad coupled to the third external electrode and a fourth pad coupled to the fourth external electrode. At least one coupling conductor line that couples the third pad to the first pad or couples the fourth pad to the second pad is formed in the mounting surface of the circuit board. The first and second pads are directly coupled to the external circuit, and the third or fourth pads coupled to the coupling conductor line are coupled to an external circuit through the first or second pads coupled to the coupling conductor line.

At least one coupling conductor line may include a first coupling conductor line for coupling the third pad to the first pad, and a second coupling conductor line for coupling the fourth pad to the second pad. The first and second pads are directly coupled to the external circuit, and the third and fourth pads may be coupled to the external circuit through the first and second pads.

The first capacitor unit may be coupled to the second capacitor unit by means of the coupling conductor line that couples pads having the same polarity. Also, the coupling conductor line may be coupled in series to the second capacitor unit, and ESR of the second capacitor unit is controllable by changing the length or width of the coupling conductor line. The second capacitor unit may be coupled to the external circuit through the first and second pads. The multilayer chip capacitor mounted in the circuit board shows impedance characteristics to have a flat portion in a frequency-impedance curve.

The vias coupled to the first and second pads may be formed as some of the external circuit in the inner part of the circuit board.

In order to minimize the size of a current loop that flows in the first capacitor unit through the first and second pads, the via coupled to the first pad may be disposed so that the via can be adjacent to the second pad, and the via coupled to the second pad may be disposed so that the via can be adjacent to the first pad. In this case, two or more vias may be coupled respectively to the first and second pads.

According to still another aspect of the present invention, there is provided a circuit board including a mounting surface for mounting the multilayer chip capacitor as defined in claim 1; and an external circuit electrically coupled to the multilayer chip capacitor, wherein a plurality of mounting pads coupled to the external electrode of the multilayer chip capacitor are formed on the mounting surface of the circuit board. A plurality of the mounting pads include a first pad coupled to the first external electrode, a second pad coupled to the second external electrode, a third pad coupled to the third external electrode and a fourth pad coupled to the fourth external electrode. At least one coupling conductor line that couples the third pad to the first pad or couples the fourth pad to the second pad is formed in the mounting surface of the circuit board. The first and second pads are directly coupled to the external circuit, and the third or fourth pads coupled to the coupling conductor line are coupled to an external circuit through the first or second pads coupled to the coupling conductor line.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. However, a variety of modifications and changes may be made without departing from the scope and spirit of the present invention. Also, the present invention is not particularly limited to exemplary embodiments of the present invention. It is understood that the exemplary embodiments of the present invention is provided for the purpose of illustrations as apparent to those skilled in the art.

Figure 1:
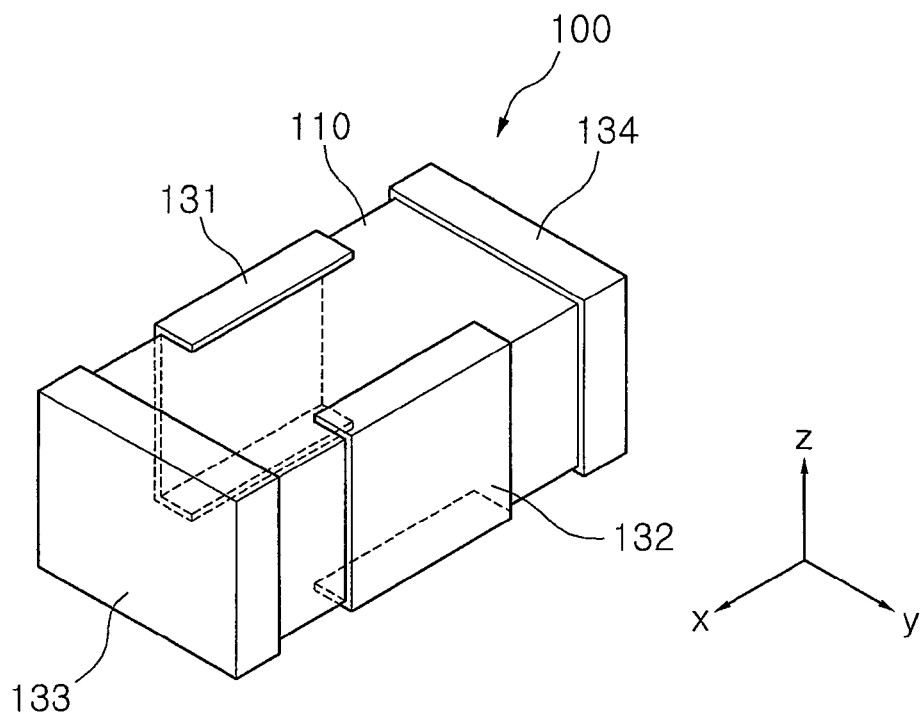
FIG. 1 is a perspective view illustrating an appearance of a multilayer chip capacitor according to one exemplary embodiment of the present invention.
Figure 2:
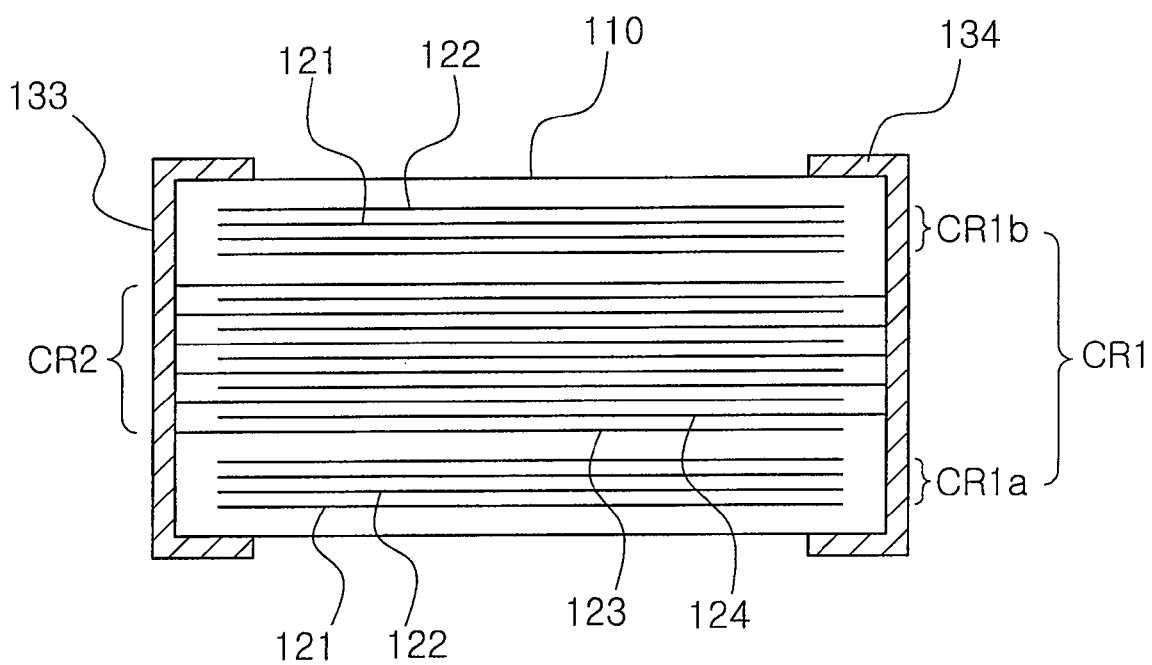
FIG. 2 is a side cross-sectional view taken from a line that is parallel to the x axis of the multilayer chip capacitor as shown in FIG. 1.
Figure 3:
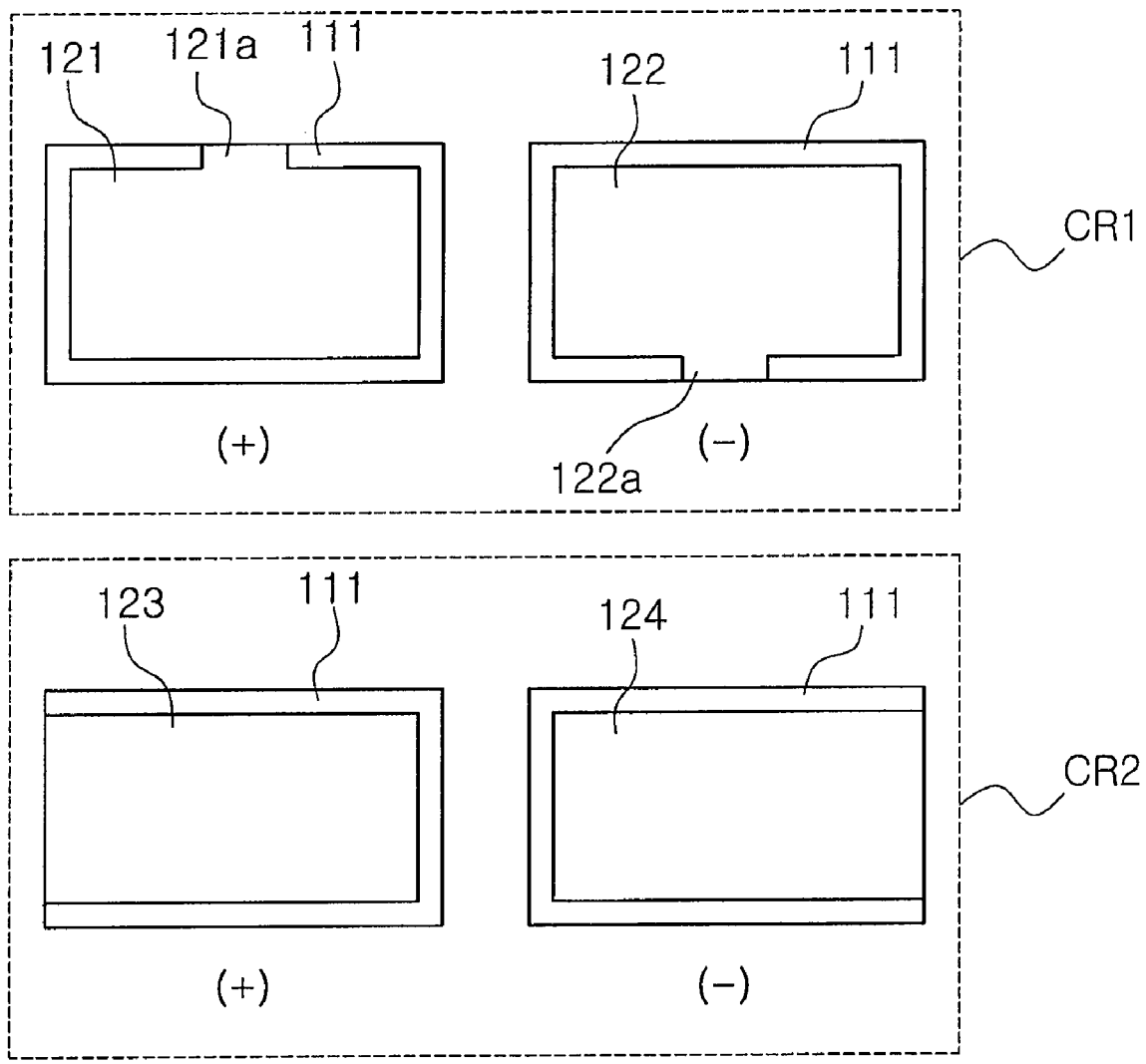
FIG. 3 is a plane view illustrating a configuration of internal electrodes of the multilayer chip capacitor as shown in FIG. 1.

FIG. 1 is a perspective view illustrating an appearance of a multilayer chip capacitor according to one exemplary embodiment of the present invention, FIG. 2 is a side cross-sectional view taken from a line (a major axis direction or a long side direction) that is parallel to the x axis of the multilayer chip capacitor as shown in FIG. 1. FIG. 3 is a plane view illustrating a configuration of internal electrodes of the multilayer chip capacitor as shown in FIG. 1.

Referring to FIGS. 1 to 3, the capacitor 100 includes a capacitor body 110, and a plurality of external electrodes 131, 132, 133 and 134 (first to fourth external electrodes in order) formed in a side surface of the capacitor body 110. The capacitor body 110 is formed by laminating a plurality of dielectric layers, and a plurality of internal electrodes 121, 122, 123 and 124 (first to fourth internal electrodes in order) are disposed in the capacitor body 110 so that the internal electrodes 121, 122, 123 and 124 can be isolated by the dielectric layers. The first internal electrode 121 and the second internal electrode 122 have different polarities, and the second internal electrode 123 and the fourth internal electrode 124 have different polarities. The first and second external electrodes 131 and 132 are disposed on two facing side surfaces of the capacitor body 110, and the third and fourth external electrodes 133 and 134 are disposed on another two facing side surfaces of the capacitor body 110. The capacitor 100 is a 4-terminal capacitor including the total 4 external electrodes, but the present invention is not particularly limited thereto.

As shown in FIGS. 2 and 3, the capacitor body 110 includes a first capacitor unit CR1a and CR1b: CR1 and a second capacitor unit CR2, both of which are arranged along a lamination direction (z-axis direction). The first capacitor unit CR1 includes first and second internal electrodes 121 and 122, all of which are alternately disposed to face each other while being isolated in the dielectric layers (the first and second internal electrodes 121 and 122 are alternately disposed in a repeated manner, as shown in FIGS. 2 and 3). The second capacitor unit CR2 includes third and fourth internal electrodes 123 and 124, all of which are alternately disposed to face each other while being isolated in the dielectric layers.

For the first capacitor unit CR1, the first internal electrode 121 is coupled to the first external electrode 131 through a lead 121a, and the second internal electrode 122 is coupled to the second external electrode 132 through a lead 122a. For the second capacitor unit CR2, the third and fourth internal electrodes 123 and 124 are coupled respectively to the third and fourth external electrodes 133 and 134. The first and second internal electrodes 121 and 122 are coupled only to the first and second external electrodes 131 and 132, but not coupled to the third and fourth external electrodes 133 and 134. In the same manner, the third and fourth internal electrodes 123 and 124 are coupled only to the third and fourth external electrodes 133 and 134, but not coupled to the first and second external electrodes 131 and 132. Accordingly, the first capacitor unit CR1 and the second capacitor unit CR2 are electrically isolated from each other within the multilayer chip capacitor 100 (i.e., the first capacitor unit and the second capacitor unit are not electrically coupled to each other before the mounting of the circuit board).

As described later, the first capacitor unit CR1 has a lower ESL than the second capacitor unit CR2 to contribute to reduction in ESL in a high frequency range, and is disposed in at least one end (i.e., an upper portion and/or a lower portion inside the capacitor) of the multilayer chip capacitor in a lamination direction (z-axis direction). The capacitor is mounted on the circuit board so that the first capacitor unit CR1a or CR1b can be disposed in a position that is more adjacent to the mounting surface of the circuit board than the second capacitor unit CR2. In particular, in this exemplary embodiment, the first capacitor units CR1a and CR1b: CR1 are disposed in both ends (namely, an upper portion and a lower portion) of the multilayer chip capacitor in a lamination direction, and the second capacitor unit CR2 is disposed between the ends of the multilayer chip capacitor. The first capacitor unit CR1 and the second capacitor unit CR2 are coupled in parallel to the mounting pad of the circuit board through the coupling conductor line (see FIGS. 3 to 5).

Also, the first capacitor unit CR1 includes internal electrodes that are smaller in number than the second capacitor unit CR2 since the number of the stacked first capacitor unit CR1 is limited to have suitable ESR, as described later. Accordingly, the second capacitor unit CR2 coupled in parallel to the first capacitor unit CR1 is used to obtain desired or predetermined capacitance. To obtain the capacitance, the total number of stacked third and fourth internal electrodes 123 and 124 in the second capacitor unit CR2 is set to a higher number than first and second internal electrodes 121 and 122 in the first capacitor unit CR1.

Accordingly, the capacitance of the second capacitor unit CR2 is higher than that of the first capacitor unit CR1, and the ESR of the second capacitor unit CR2 is lower than that of the first capacitor unit CR1 due to relatively lower number of the stacked internal electrodes. Also, the second capacitor CR2 has higher ESL than the first capacitor unit CR1 since the second capacitor CR2 is disposed in a higher position than the first capacitor unit CR1a adjacent to the mounting surface. When a capacitor unit having a relatively lower ESL is disposed adjacent to the mounting surface, a current path is more shortened, which leads to the decreased ESL of the entire capacitor (see FIG. 8).

Preferably, the current paths in the first and second internal electrodes 121 and 122 have a shorter length than the current paths in the third and fourth internal electrodes 123 and 124 so as to contribute to the fact that the first capacitor unit CR1 has a lower ESL than the second capacitor unit CR2. Therefore, a distance (distance in a y-axis direction) between the first and second side surfaces in which the first and second external electrodes 131 and 132 are formed is preferably smaller than a distance (distance in an x-axis direction) between the third and fourth side surfaces in which the other external electrodes 133 and 134 are formed so that the current path between the first and second external electrodes 131 and 132 can be shorter than the current path between the third and fourth external electrodes 133 and 134 (see FIG. 1).

Referring to FIG. 2, the first capacitor units CR1a and CR1b are arranged in both ends, for example an upper portion and a lower portion, of the capacitor body 110 in a lamination direction, and the second capacitor unit CR2 is arranged between the first capacitor units CR1a and CR1b. In particular, the entire capacitor may ensure its upper and lower symmetry by symmetrically disposing the first capacitor units CR1a and CR1b arranged in both ends of the capacitor body 110. In mounting the capacitor, directionality in the upper and lower portions of the capacitor disappears due to this upper and lower symmetry, which makes it easy to mount the capacitor (e.g., it is possible to mount the capacitor without distinction of its upper and lower portions).

A circuit board having a mounting pad configuration, as described later with reference to FIGS. 4 and 7, may be used to realize impedance of a power distribution network that is maintained as low and constantly as possible in a wide frequency range using the above-mentioned capacitor.

Figure 4:
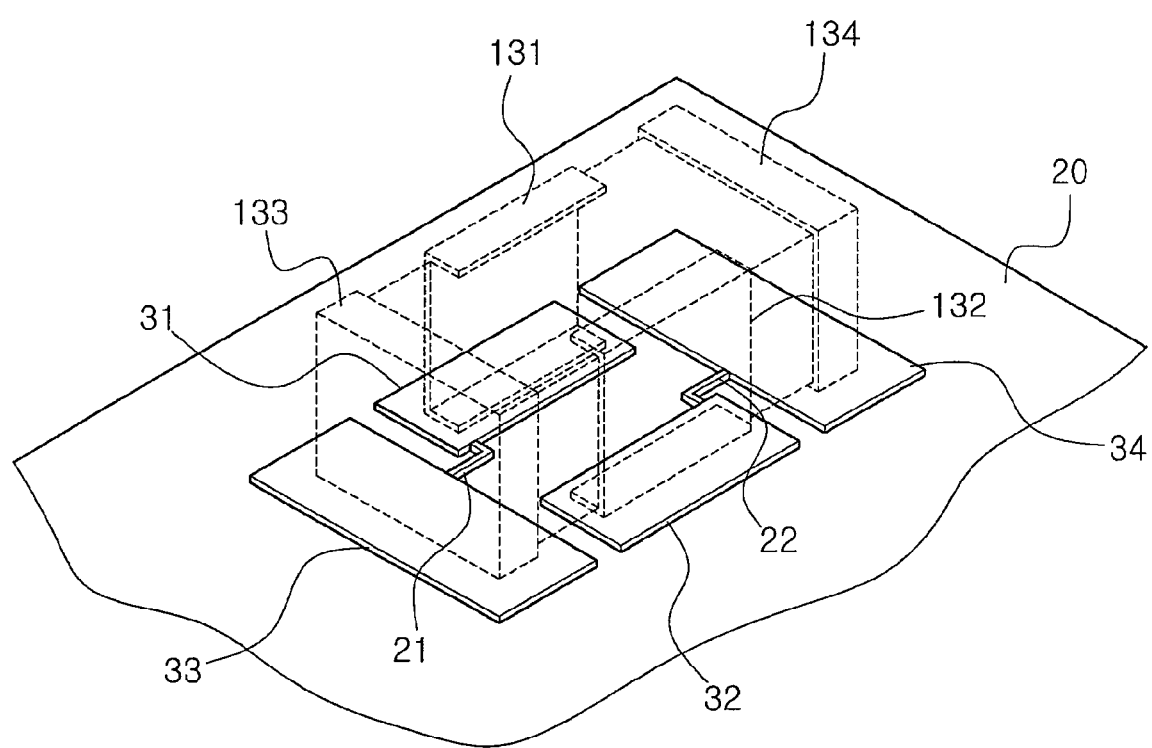
FIG. 4 is a perspective view illustrating a circuit board apparatus in which the multilayer chip capacitor as shown in FIG. 1 is mounted in a circuit board.

FIG. 4 shows a circuit board apparatus according to one exemplary embodiments of the present invention. In FIG. 1, the capacitor 100 is mounted in a circuit board 20. Referring to FIG. 4, mounting pads 31, 32, 33 and 34 (first to fourth pads in order) are formed in a capacitor mounting surface of the circuit board 20. The mounting pads 31 to 34 are electrically coupled with an external circuit provided in the circuit board 20. The capacitor 100 is disposed on the mounting surface so that the first capacitor unit CR1 having lower equivalent series inductance (ESL) than the second capacitor unit CR2 can be disposed adjacent to the mounting surface.

The first pad 31 of the circuit board 20 is connected to the first external electrode 131 of the capacitor, the second pad 32 of the circuit board 20 is connected to the second external electrode 132, the third pad 33 of the circuit board 20 is connected to the third external electrode 133, and the fourth pad 34 of the circuit board 20 is connected to the fourth external electrode 134. The first pad 31 and the third pad 33 are coupled to each other by a first coupling conductor line 21, and the second pad 32 and the fourth pad 34 are coupled to each other by a second coupling conductor line 22. Therefore, the first and third pads 31 and 33 have the same one polarity (for example, positive (+) polarity) together with the first and third external electrodes 131 and 133, and the second and fourth pads 32 and 34 have the same other polarity (for example, negative (−) polarity) together with the second and fourth external electrodes 132 and 134. The first capacitor unit CR1 and the second capacitor unit CR2 are coupled in parallel through the coupling conductor line.

Figure 7:
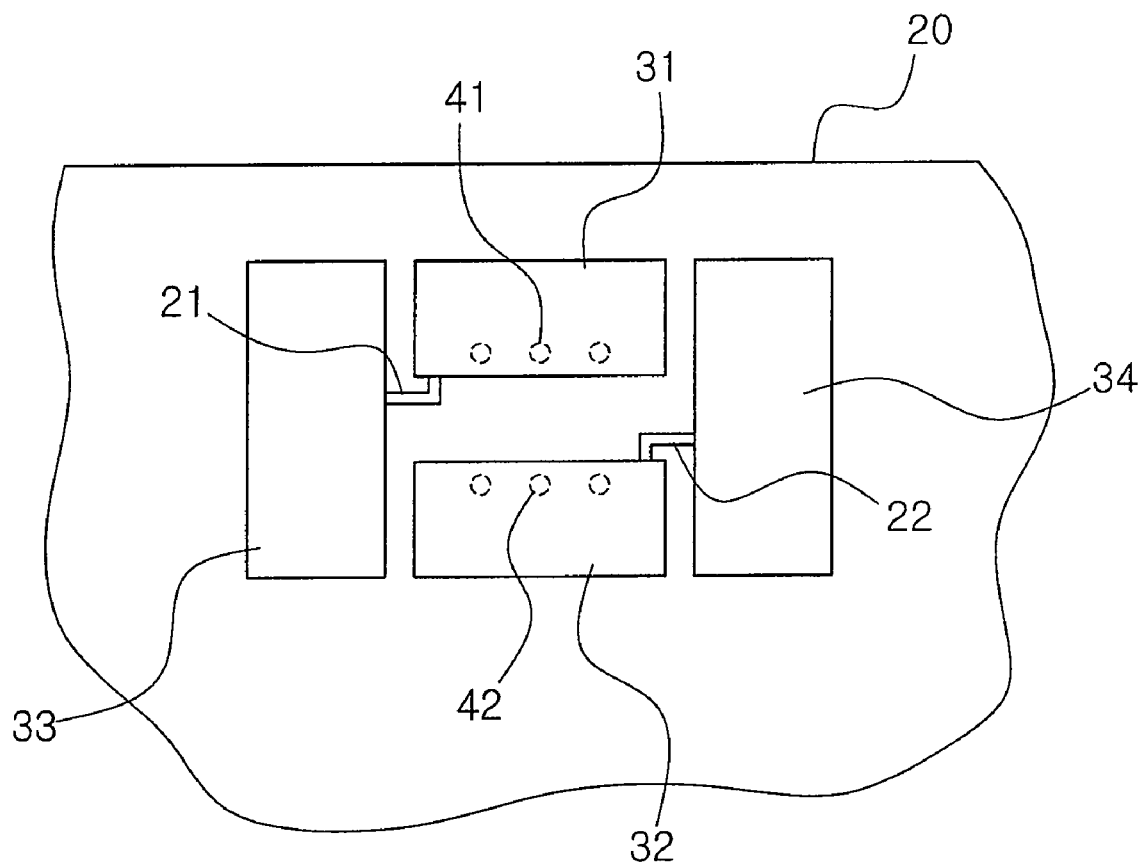
FIG. 7 is a schematic plane view illustrating the circuit board as shown in FIG. 4.

Here, the pads (for example, first and second pads 31 and 32) connected to the first and second external electrodes 131 and 132 are directly coupled to an external circuit of the circuit board 20, but the pads (for example, third and fourth pads 33 and 34) connected to the third and fourth external electrodes 133 and 134 are not directly coupled to the external circuit of the circuit board 20 but coupled to the external circuit through the first and second pads 31 and 32 coupled to the coupling conductor lines 21 and 22 (see FIG. 7). Finally, the second capacitor unit CR2 is coupled to the external circuit of the circuit board 20 through the first and second pads 31 and 32.

The coupling conductor lines 21 and 22 function to couple the first and second capacitor units CR1 and CR2 in parallel to each other through the coupling between the pads with the same polarity, and also have the substantially same function as to control ESR of the second capacitor unit by adding resistances in series to the second capacitor unit CR2. Therefore, when the proposed capacitor 100 is mounted in the pad configuration of the above-mentioned circuit board 20, it is possible to control the ESR of the multilayer chip capacitor since the second capacitor unit CR2 may be realized with a substantially similar ESR to that of the first capacitor unit CR1 (see FIGS. 9, 11, 21 and 23).

Figure 5:
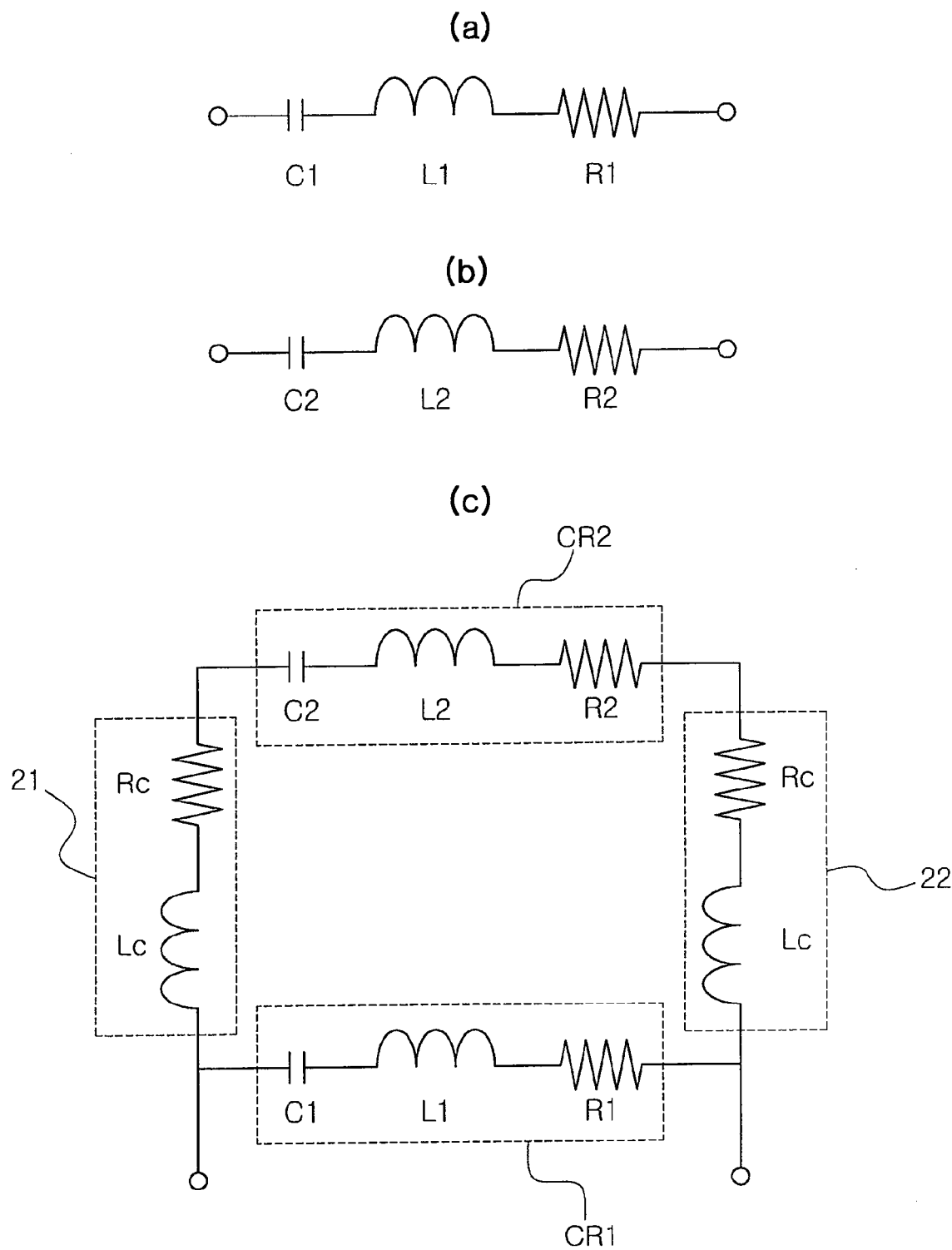
FIG. 5 is an equivalent circuit view illustrating a first capacitor unit (a), a second capacitor unit (b) and a multilayer chip capacitor (c), which is mounted in the circuit board, in the circuit board apparatus as shown in FIG. 4.

FIG. 5 is an equivalent circuit view illustrating a first capacitor unit (FIG. 5(a)), a second capacitor unit (FIG. 5(b)) and a multilayer chip capacitor (FIG. 5(c)) mounted in the mounting surface of the circuit board in the circuit board apparatus 20 and 100 of FIG. 4 in which the capacitor 100 is mounted in the circuit board 20. As shown in FIGS. 5(a) and (b), an equivalent circuit of the first capacitor unit CR1 in the capacitor 100 may be represented by a series circuit of capacitance (C1), inductance (L1) and resistance (R1), and an equivalent circuit of the second capacitor unit CR2 may be also represented by a series circuit of capacitance (C2), inductance (L2) and resistance (R2) in the same manner as in the equivalent circuit of the first capacitor unit CR1. As described above, the relations C1<C2, L1<L2 and R1>R2 are satisfied.

Since the first and second capacitor units CR1 and CR2 are coupled in parallel to each other through the coupling conductor lines 21 and 22, and a terminal of the external circuit is connected to the first capacitor CR1, resistances (Rc) and inductances (Lc) of the first and second coupling conductor lines 21 and 22 are added in series to resistance (R2) and inductance (L2) of the second capacitor unit CR2, and the series circuit units 21, CR2 and 22 are coupled in parallel to an equivalent circuit unit C1−L1−R1 of the first capacitor unit CR1, as shown in FIG. 5(c). FIG. 5(c) shows that the first coupling conductor line 21 and the second coupling conductor line 22 have the same resistance (Rc) and inductance (Lc), but the present invention is not particularly limited thereto. Therefore, the coupling conductor lines 21 and 22 may have different resistance and/or inductance.

Figure 6:
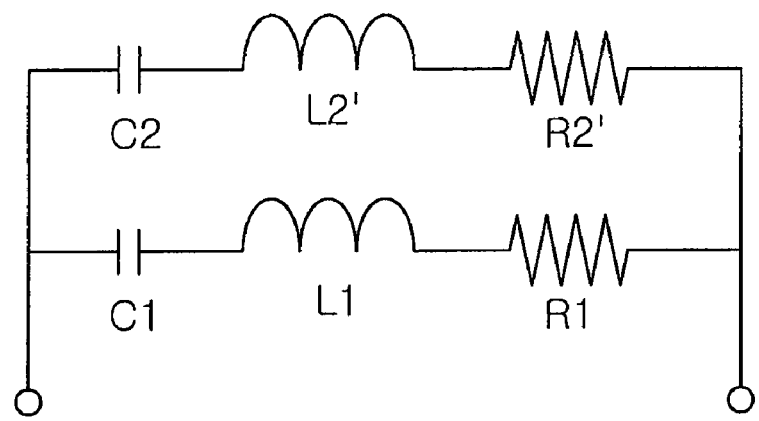
FIG. 6 is an equivalent circuit view illustrating the multilayer chip capacitor (c) as shown in FIG. 5 more simply.

The equivalent circuit of FIG. 5(c) may be configured in brief as shown in FIG. 6. In FIG. 6, the relation of L2' and R2' is represented by the following Equation 1, as follows.

$$L2'=L2+2Lc, R2'=R2+2Rc \qquad \text{Equation 1}$$

Therefore, the second capacitor unit CR2 has such effect that the ESR of the second capacitor unit CR2 is substantially increased by the addition of the resistances 2Rc of the coupling conductor lines 21 and 22.

As described above, the second capacitor unit CR2 has a higher number of stacked internal electrodes than the first capacitor unit CR1 for the purpose of securing its capacitance, and therefore the ESR of the second capacitor unit CR2 is lower than that of the first capacitor unit CR1 (the ESR of the first and second capacitor units CR1 and CR2 decreases since their resistances are additionally linked in parallel with the increase in the number of the stacked internal electrodes). This difference in ESR functions as a factor that makes it difficult to maintain constant impedance of a capacitor (particularly, a pointed minimum region is formed in a region in the vicinity of each resonance frequency). However, the difference in ESR between the two capacitor units CR1 and CR2 is substantially decreased since the ESR of the second capacitor unit CR2 is substantially increased by the serial addition of the resistances 2Rc of the coupling conductor lines 21 and 22, which makes it possible to realize a constant impedance characteristic in a wide frequency band.

The ESL (inductance) of the second capacitor unit CR2 shows such effect that it can be substantially increased due to the presence of the coupling conductor lines 21 and 22, as represented by the Equation 1. However, the ESL and impedance of the entire multilayer chip capacitor in the high frequency band are mainly affected by the ESL of the first capacitor unit CR1, regardless of the substantial increase in the ESL of the second capacitor unit CR2. The reason is that the current path is confined to the first capacitor unit CR1 as the least impedance current path at high frequencies. As a result, it is possible to maintain a low ESL of the entire capacitor in the high frequency band, as well as to implement constant impedance in the wide frequency band.

Figure 8:
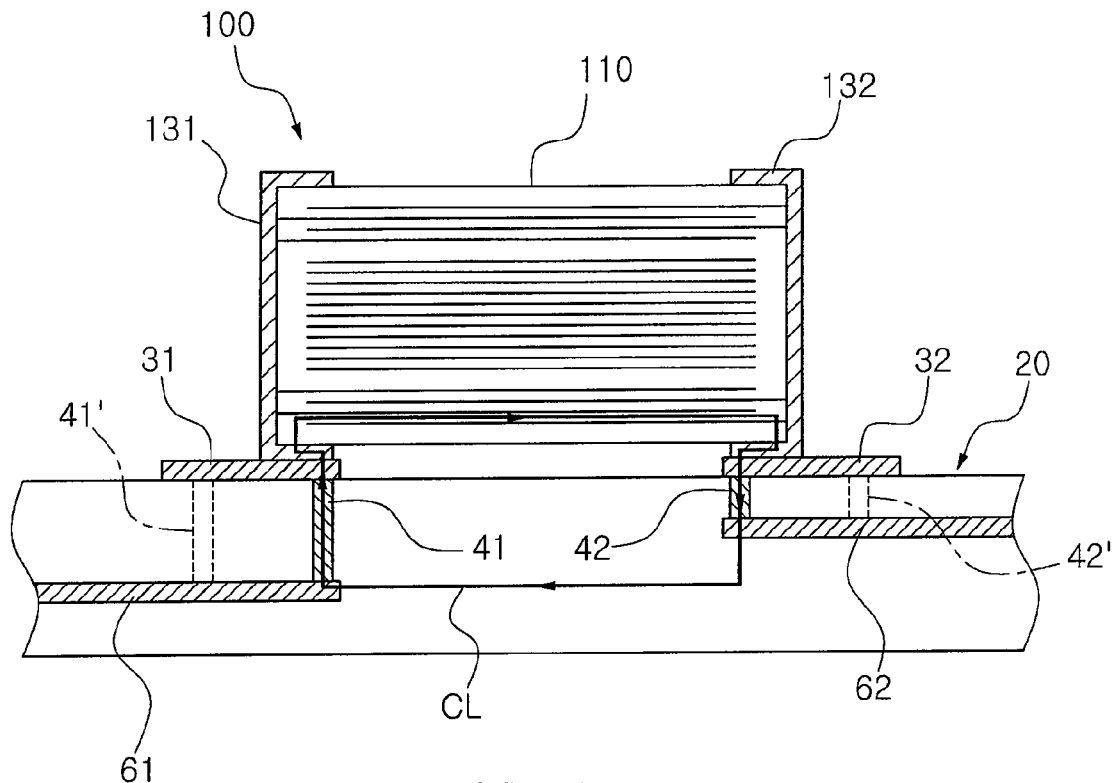
FIG. 8 is a side cross-sectional view illustrating the circuit board apparatus as shown in FIG. 4.

FIG. 7 is a schematic plane view illustrating the circuit board as shown in FIG. 4, and FIG. 8 is a side cross-sectional view illustrating the circuit board apparatus as shown in FIG. 4. Referring to FIGS. 7 and 8, mounting pads 31 to 34 are disposed on the substrate 20, and first and second coupling conductor lines 21 and 22 for coupling the mounting pads are formed in the substrate 20. Vias 41 and 42 are formed as parts of an external circuit (for example, a circuit for applying a power voltage to a decoupling capacitor) in the circuit board 20. Here, the vias 41 and 42 are connected only to the first and second pads that are coupled to the first capacitor unit. The first pad 31 may be coupled to a first electrode pattern 61 (for example, power supply electrode pattern) through the via 41, and the second pad 32 may be coupled to second electrode pattern 62 (for example, ground electrode pattern) through the via 42.

As shown in FIG. 8, the via 41 connected to the first pad is disposed adjacent to the second pad, and the via 42 connected to the second pad is disposed adjacent to the first pad. As the vias 41 and 42 having different polarities are disposed adjacent to each other, the current loop (CL) that flows in the first capacitor unit through the first and second pads 31 and 32 is decreased in size, which leads to the decrease in inductance by the current loop. When vias 41' and 42' having different polarities are disposed remote from each other as shown by dotted line in FIG. 8, the size of its current loop is increased commensurate with the distance therebetween, and therefore the inductance by the increased current loop is also increased.

Also, two or more vias (FIG. 7 shows three vias connected respectively to the first and second pads) are preferably connected respectively to the first and second pads 31 and 32. This is why the mounting of the two or more vias makes it possible to connect the inductances in parallel in the current loop, and thus to further reduce the inductance.

Materials of the coupling conductor lines 21 and 22 may be suitably selected to control the resistance (Rc) and/or the inductance (Lc) added in series to the second capacitor unit CR1 by means of the coupling conductor lines 21 and 22. For example, the mounting pads 31 to 34 are generally formed of materials such as copper (Cu), and the coupling conductor lines 21 and 22 may be also formed of materials such as copper (Cu). However, other metal materials may be used to control the resistance (Rc) or inductance (Lc). Also, the resistance (Rc) and/or inductance (Lc) of the coupling conductor lines 21 and 22 may be varied by controlling the length or width of the coupling conductor lines 21 and 22, and therefore it is possible to substantially control the ESR of the second capacitor unit.

EXAMPLES 1 and 2

Figure 9:
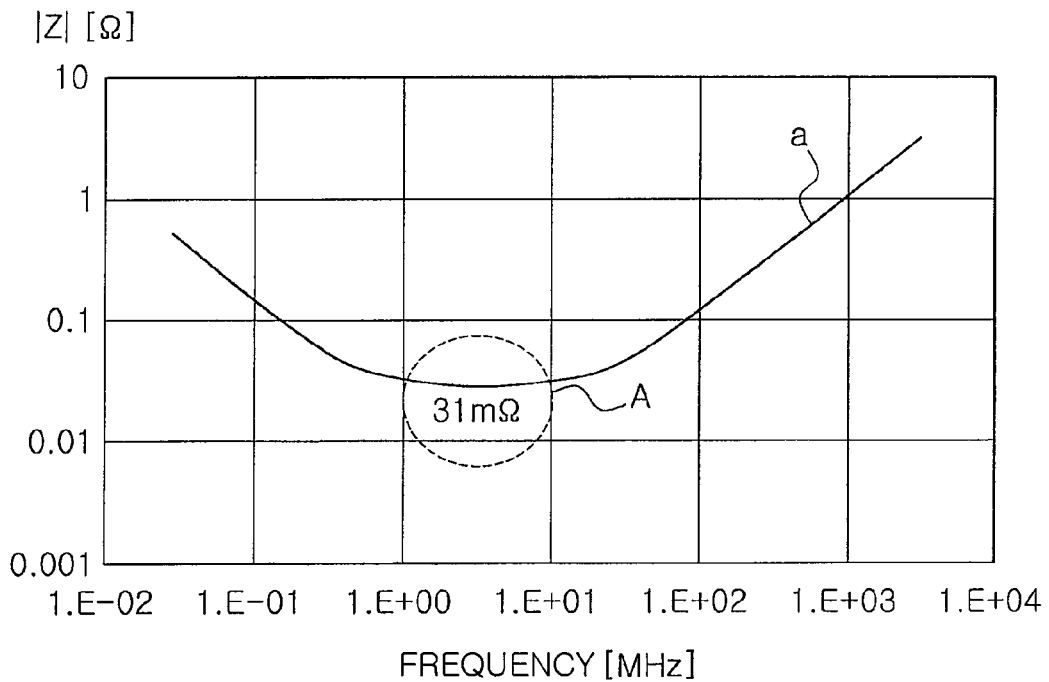
FIG. 9 is a graph illustrating frequency vs. impedance characteristics of the multilayer chip capacitor according to one exemplary embodiment of the present invention.

FIG. 9 is a graph illustrating frequency vs. impedance (f-z) characteristics of the multilayer chip capacitor according to one exemplary embodiment of the present invention. The graph of FIG. 9 shows the results of measuring frequency-impedance of samples having the capacitor and the circuit board apparatus according to the exemplary embodiments of FIGS. 1 to 4.

Particularly, a sample of Example 1 as shown in FIG. 9 conforms to a multilayer chip capacitor with 1608 size (1.6 mm×0.8 mm) and 4 terminals having 10 μF capacitance. The capacitance of the first capacitor unit is 0.52 μF, and the capacitance of the second capacitor unit is 9.48 μF. Also, the ESL and ESR of the first capacitor unit are 300 pH and 60 mΩ, respectively, and the actual ESL and ESR (L2', R2' as shown in FIG. 6) of the second capacitor unit to which the coupling conductor lines are added in series are 700 pH and 35 mΩ, respectively. Regardless of the large capacitance difference in the first and second capacitor units, the serial addition of the coupling conductor lines allows the second capacitor unit to implement the ESR that matches the ESR of the first capacitor unit.

As the results of measuring the frequency-impedance of the above-mentioned sample of Example 1, it is shown that an impedance curve (a) is flat in a frequency region (region A) around the resonance frequency (a constant impedance of about 31 mΩ in the flat portion), as shown in FIG. 9. This indicates that the impedance has a constant value in a relatively wider frequency band without the radical changes in the impedance. The impedance characteristics of the sample of Example 1 are more clearly understood through the comparison with a frequency-impedance curve (see FIG. 10) to the sample of Comparative example.

Figure 10:
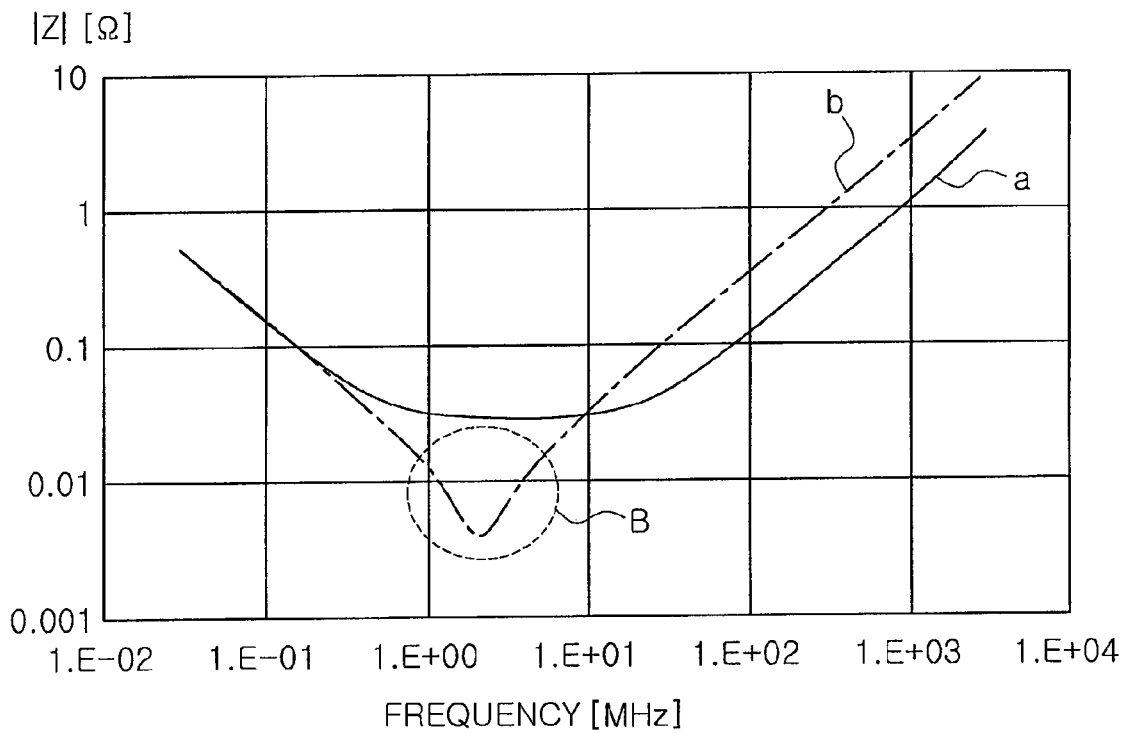
FIG. 10 is a graph illustrating the results obtained by comparing the frequency vs. impedance characteristics of the multilayer chip capacitors according to Example as shown in FIG. 9 and Comparative example.

FIG. 10 is a graph illustrating the results obtained by comparing the frequency vs. impedance characteristics of the multilayer chip capacitors according to Example 1 as shown in FIG. 9 and Comparative example. A curve (b) showing frequency vs. impedance characteristics of the multilayer chip capacitor of Comparative example as shown in FIG. 10 shows a result of measuring a conventional capacitor sample with 1608 size (1.6 mm×0.8 mm) and 2 terminals having 10 μF capacitance. The capacitor sample of Comparative example has a repeatedly stacked configuration of different-polarity internal electrodes in which capacitors are alternately coupled to only two external electrodes without dividing the capacitors into two capacitor units. The characteristics (average ESL and the minimum impedance (Min |Z|)) of the samples of Comparative example and Example 1 are listed in the following Table 1.

TABLE 1

| Samples | ESL (Average, SRF ~3 GHz) | Min |Z| |
|---|---|---|
| Comparative example | 578 pH | 4.5 mΩ |
| Example 1 | 213 pH | 31.1 mΩ |

As shown in FIG. 10, the capacitor sample (b) of Comparative example has a pointed minimum region formed in the frequency-impedance curve since the very radical changes in impedance are caused around a resonance frequency region (region B), and the capacitor sample (a) of Example 1 has a flat portion around the region B. Therefore, the changes in impedance of the capacitor sample are significantly stable, compared to that of the capacitor sample of Comparative example. Also, the capacitor sample of Example 1 has lower impedance than the capacitor sample (a) of Comparative example (b) in the high frequency band.

The frequency-impedance characteristics, the shape of the flat portion on the curve, the minimum impedance or the average ESL may be controlled by adjusting the number of the stacked internal electrodes in the first capacitor unit and/or the second capacitor unit, or the inductance or resistance of the coupling conductor lines.

Figure 11:
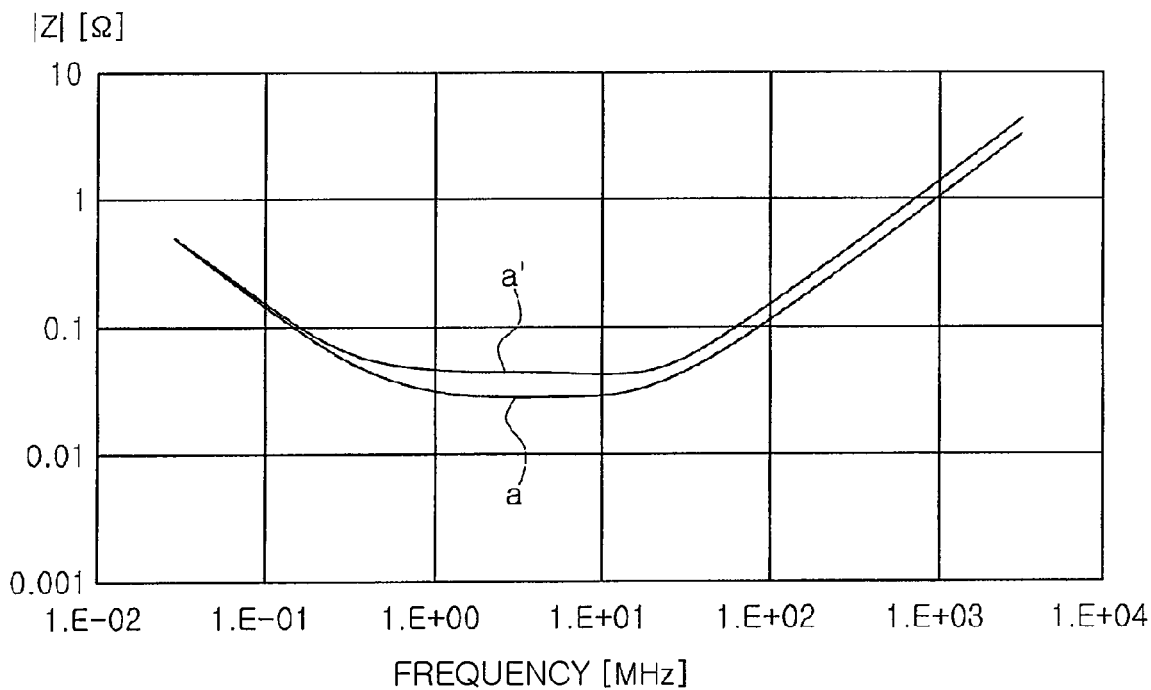
FIG. 11 is a graph illustrating the results obtained by comparing the frequency vs. impedance characteristics of the multilayer chip capacitors in two Examples.

FIG. 11 is a graph illustrating the results obtained by comparing the frequency vs. impedance characteristics of the multilayer chip capacitors in two Examples. In FIG. 11, a curve (a) represents a sample of Example 1 as shown above in FIG. 9, and a curve (a') represents a sample of Example 2. Like the capacitor sample of Example 1, the sample of Example 2 is a multilayer chip capacitor with 1608 size and 4 terminals having 10 μF capacitance, and conforms to the capacitor and the circuit board apparatus as shown in FIGS. 1 to 4. There is the difference in characteristics of the samples of Examples 1 and 2 under the control of the number of the stacked internal electrodes or the inductance and resistance of the coupling conductor lines, as listed in the following Table 2.

TABLE 2

| Sample | ESL (Average, SRF ~3 GHz) | Min |Z| |
|---|---|---|
| Example 2 | 261 pH | 49.7 mΩ |
| Example 1 | 213 pH | 31.1 mΩ |

As shown in FIG. 11 and Table 2, the capacitor sample of Example 2 has higher minimum impedance than the capacitor sample of Example 1.

Figure 12:
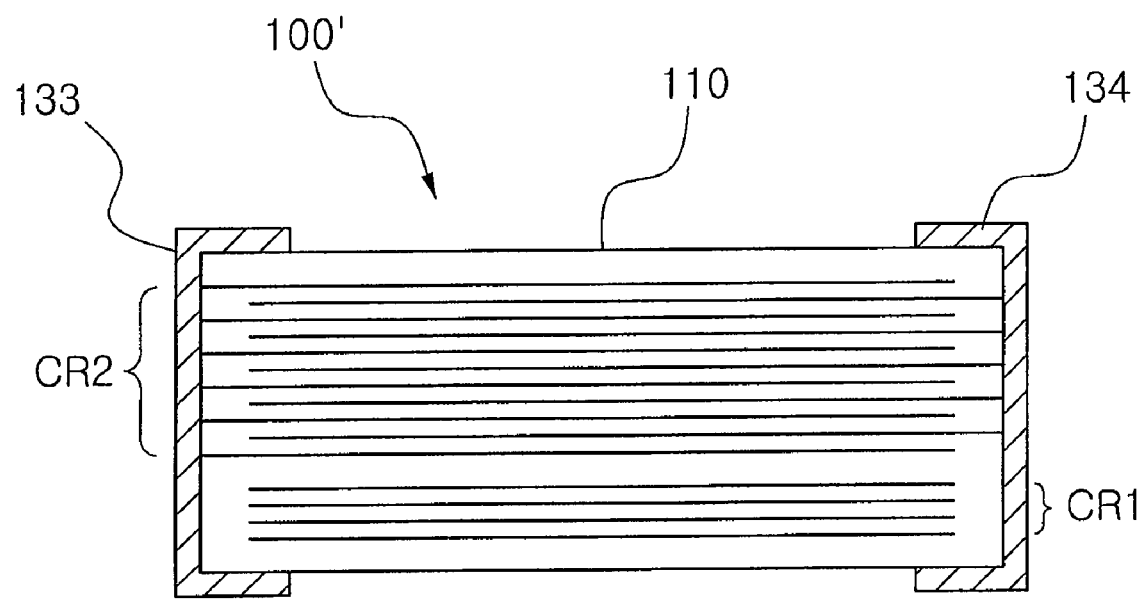
FIG. 12 is a side cross-sectional view illustrating a multilayer chip capacitor according to another exemplary embodiment of the present invention.

FIG. 12 is a side cross-sectional view illustrating a multilayer chip capacitor according to another exemplary embodiment of the present invention. For the exemplary embodiment of FIG. 12, the first capacitor unit CR1 is arranged in one end, rather than both ends, of the capacitor body 110 in a lamination direction (i.e., the first capacitor unit (CR1b) is not present in one end of the capacitor body 110 for the exemplary embodiment of FIG. 1. Particularly, when the multilayer chip capacitor is mounted in the circuit board, the first capacitor unit CR1 is arranged in a lower portion of the capacitor body 110 that is in contact with a mounting surface, and the second capacitor unit CR2 is arranged in an upper portion of the capacitor body 110. For this embodiments, the first capacitor unit CR1 and the second capacitor unit CR2 satisfies the relations of C1<C2, L1<L2 and R1>R2, the circuit board apparatuses of FIGS. 4, 7 and 8 are used herein, and therefore the equivalent circuit views of FIGS. 5 to 6 are applicable.

Therefore, it is possible to implement the constant impedance characteristics in a relatively wider frequency region, and the low ESL and impedance characteristics in a high frequency band, as well as to achieve the desired capacitance. However, the capacitor does not have upper and lower symmetry unlike the capacitor according to the exemplary embodiment of FIG. 1.

Figure 13:
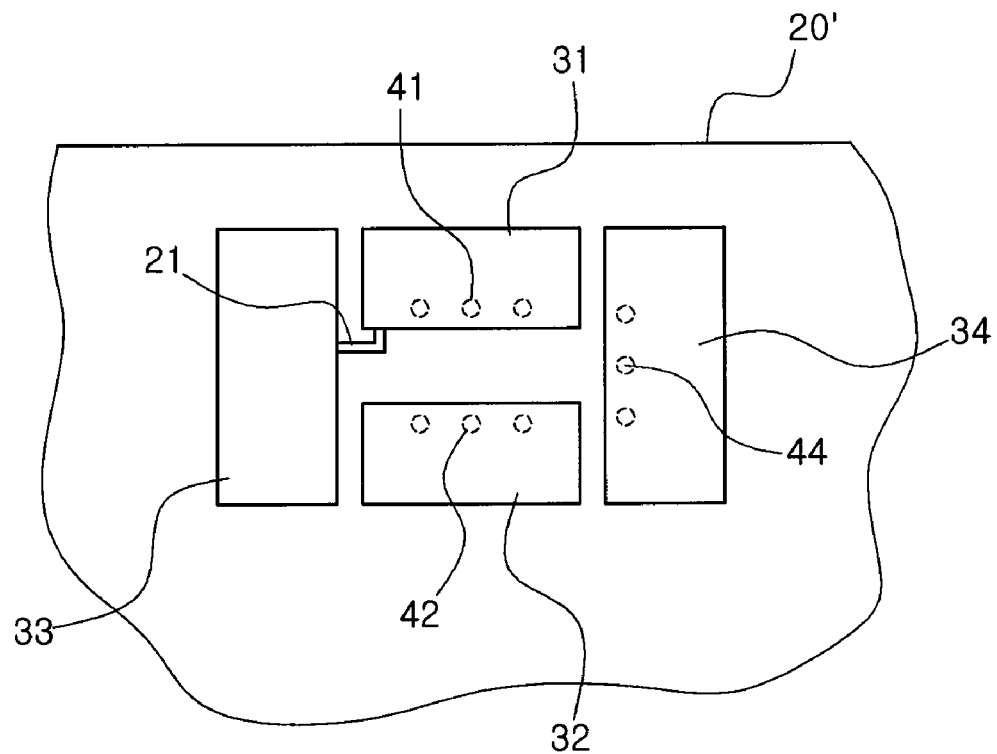
FIG. 13 is a schematic plane view illustrating a modified example of the circuit board as shown in FIG. 7.

For the above-mentioned embodiment of FIG. 7, both of the two coupling conductor lines 21 and 22 are used, but only one of the two coupling conductor lines 21 and 22 may be used herein (see FIG. 13). In this case, the resistance and inductance are added in series to the second capacitor unit CR1 through one of the coupling conductor lines.

FIG. 13 is a schematic plane view illustrating a modified example of the circuit board as shown in FIG. 7. Like the above-mentioned exemplary embodiment of FIG. 4, the capacitor 100 or 100' may be mounted on a circuit board 20' as shown in FIG. 13. However, the first pad 31 and the third pad 33, both of which have the same one polarity, are coupled to each other by means of the coupling conductor line 21, and the second pad 32 and the fourth pad 34, both of which have the same other polarity, are not coupled to each other through the coupling conductor line (the coupling conductor line 22 is omitted in FIG. 7). In this case, the external circuits such as the vias 41, 42 and 44 are connected to the fourth pad 44 as well as the first and second pads 41 and 42. The third pad 33 is coupled to the external circuits through the first pad 31 coupled to the coupling conductor line 21. The first capacitor unit CR1 and the second capacitor unit CR2 of the capacitor mounted on the circuit board 20' are coupled in parallel through the coupling conductor line 21. The second capacitor unit CR2 of the capacitor mounted on the circuit board 20' is coupled to the external circuit through the first and second pads 31 and 32.

Figure 14:
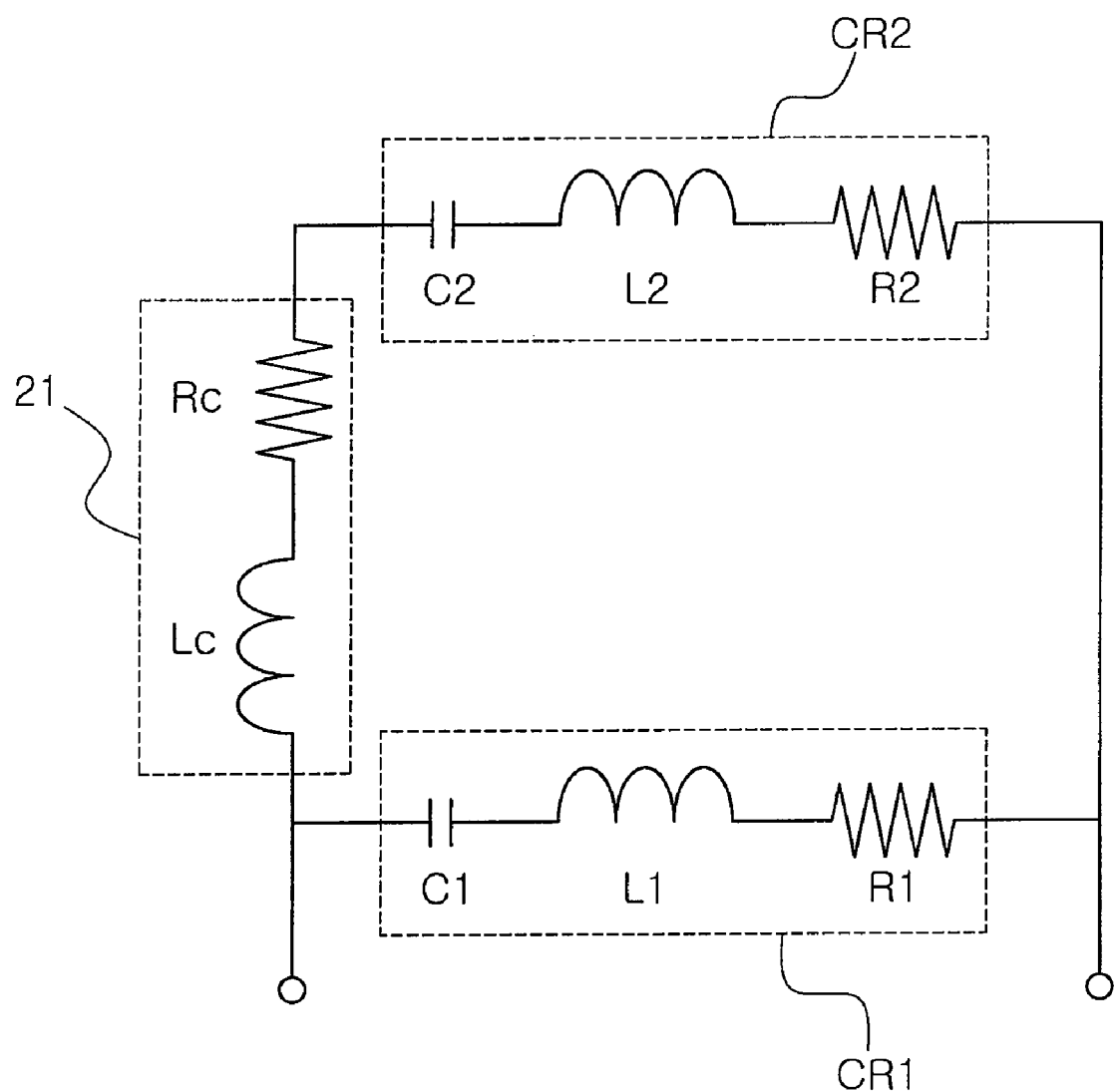
FIG. 14 is an equivalent circuit view illustrating the multilayer chip capacitor mounted in the circuit board as shown in FIG. 13, which corresponds to the circuit view of FIG. 5(c).

FIG. 14 is an equivalent circuit view illustrating a multilayer chip capacitor mounted in the circuit board as shown in FIG. 13, which corresponds to the multilayer chip capacitor as shown in FIG. 5(c). As shown in FIG. 14, resistance (Rc) and inductance (Lc) of the coupling conductor line 21 are added in series to the second capacitor unit (CR2: C2–L2–R2), and the series circuit unit 21 (CR2) is coupled to the first capacitor unit (CR1: C1–L1–R1). The equivalent circuit as shown in FIG. 14 will be described in more brief as shown in FIG. 6 (provided that L2'=L2+Lc, R2'=R2+Rc). Therefore, the second capacitor unit CR2 has such effect that the ESR of the second capacitor unit CR2 is substantially increased by the addition of the resistances 2Rc through the coupling conductor line 21. Therefore, it is possible to obtain a frequency-impedance curve having a flat portion.

For the above-mentioned embodiment as shown in FIG. 13, only the first pad 31 and the third pad 33 having one polarity are coupled to the coupling conductor line 21. However, for the different embodiment, only the second pad 32 and the fourth pad 34 having different polarities are coupled to the coupling conductor line 22, and the first pad 31 and the third pad 33 may not be coupled to the coupling conductor line (the coupling conductor line 21 is omitted in FIG. 7). In this case, the vias of the external circuit are connected to the first, second and third pads 31, 32 and 33, and the fourth pad 34 is coupled to the external circuit through the second pad 32 that is coupled to the coupling conductor line 22. The equivalent circuit view and impedance characteristic of the mounted capacitor are the same as in the above-mentioned exemplary embodiments of FIGS. 13 and 14

Figure 15:
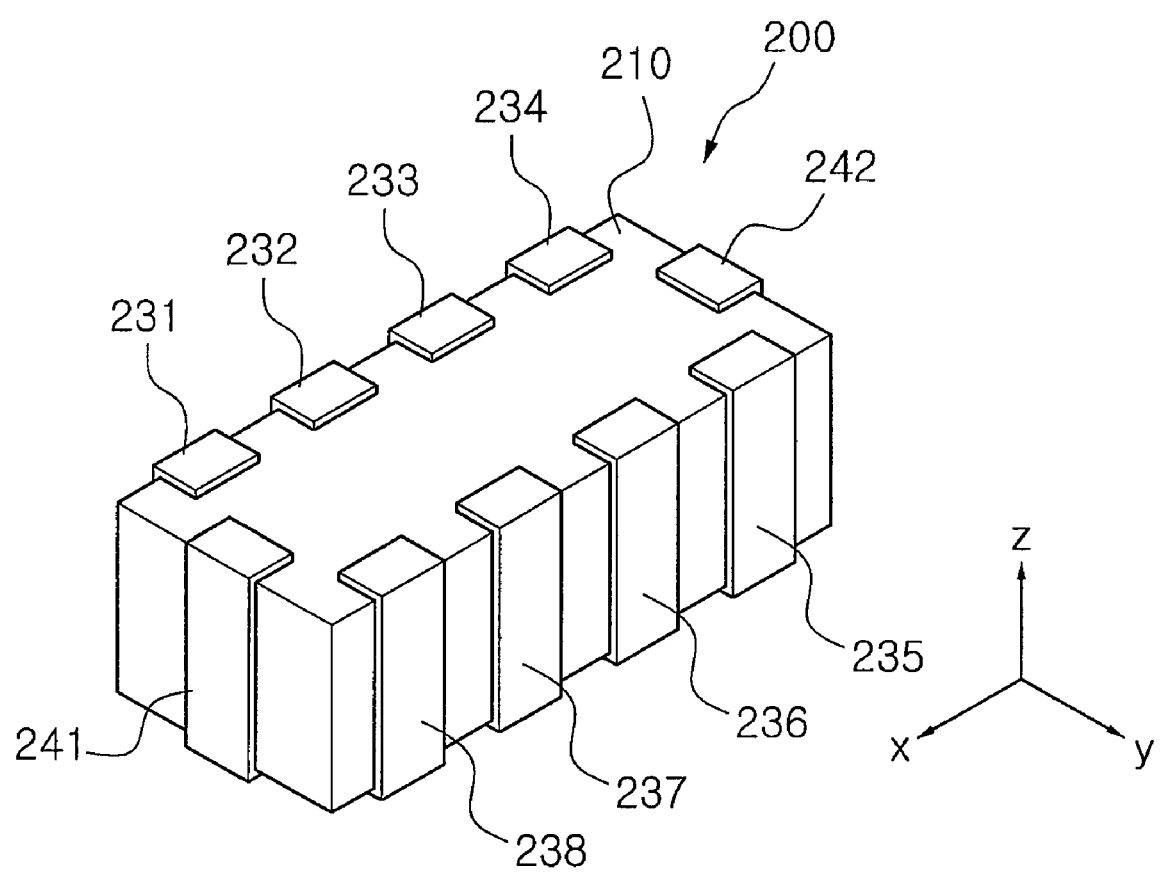
FIG. 15 is a perspective view illustrating an appearance of a multilayer chip capacitor according to still another exemplary embodiment of the present invention.
Figure 16:
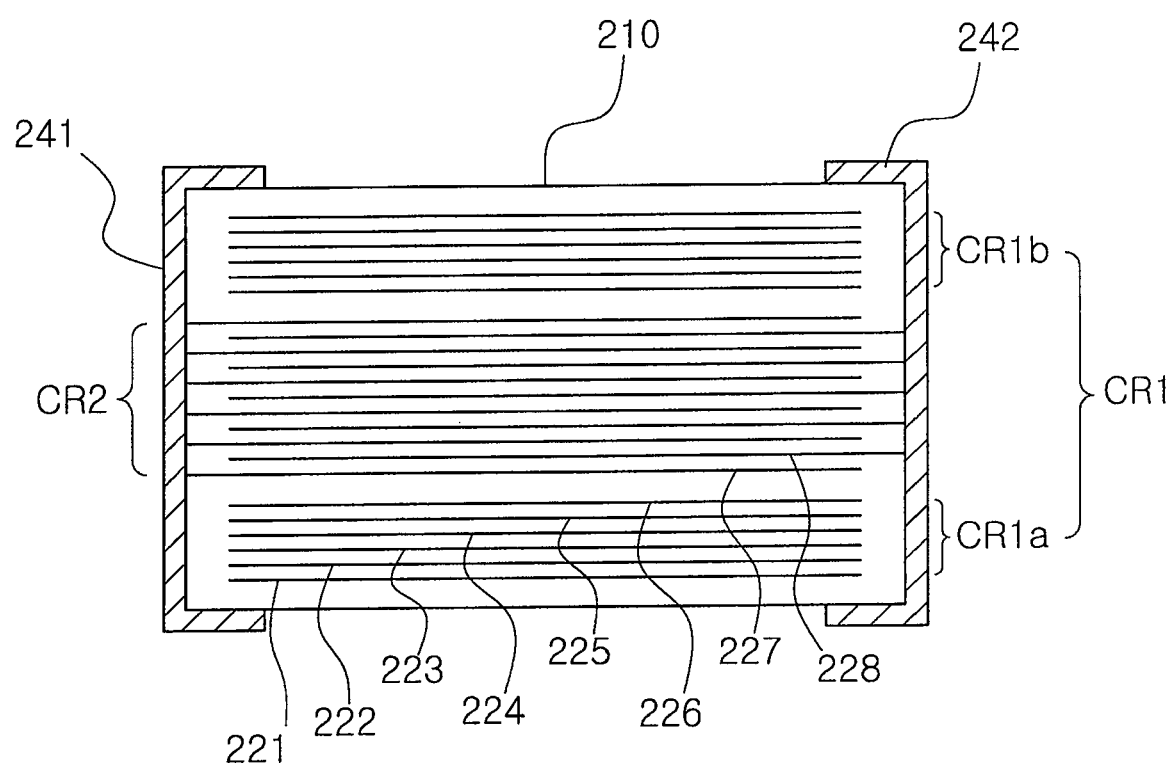
FIG. 16 is a side cross-sectional view taken from a line that is parallel to the x axis of the multilayer chip capacitor as shown in FIG. 15.
Figure 17:
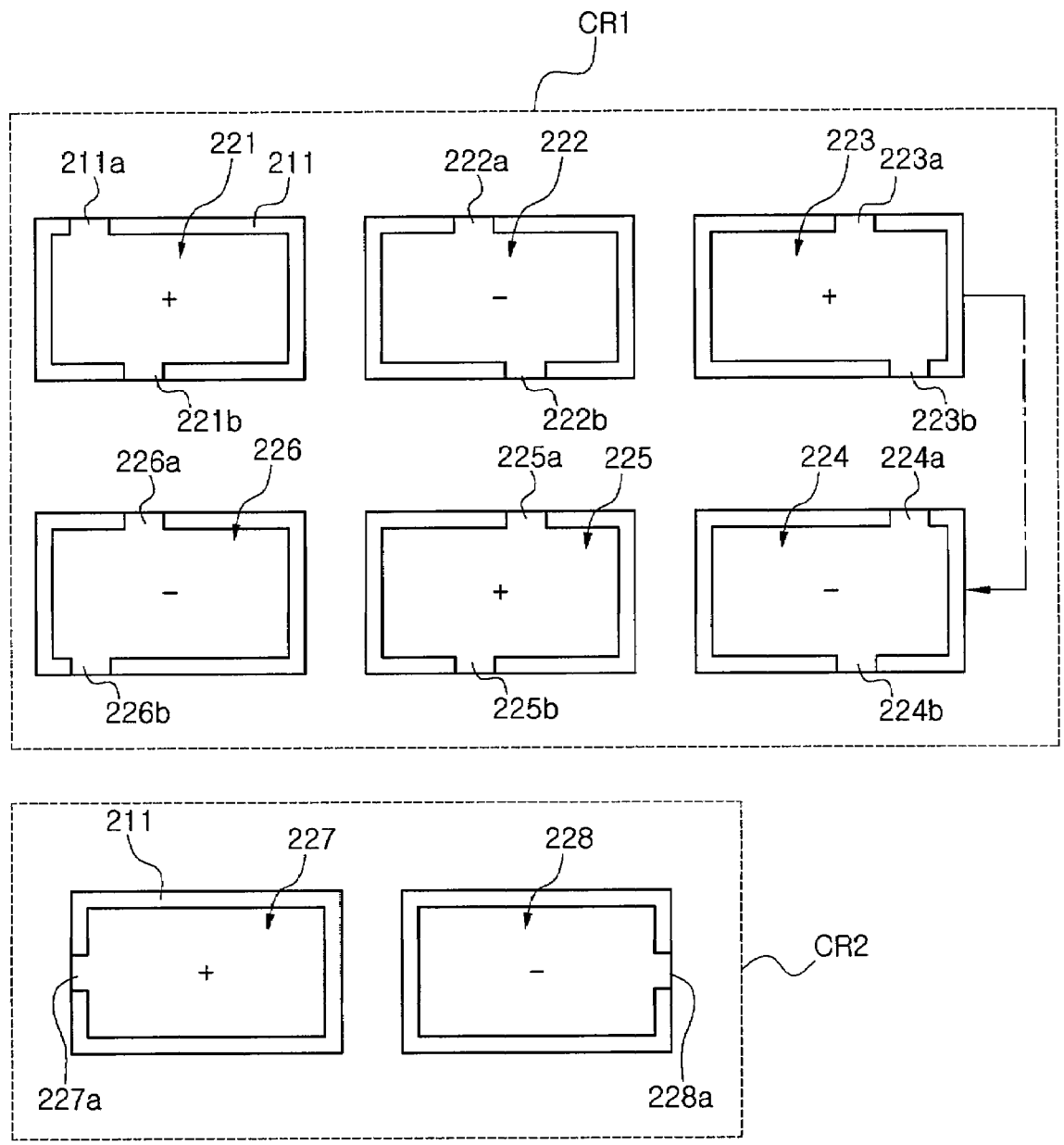
FIG. 17 is a plane view illustrating a configuration of internal electrodes of the multilayer chip capacitor as shown in FIG. 15.

FIG. 15 is a perspective view illustrating an appearance of a multilayer chip capacitor according to still another exemplary embodiment of the present invention, FIG. 16 is a side cross-sectional view taken from a line that is parallel to the x axis of the multilayer chip capacitor as shown in FIG. 15, and FIG. 17 is a plane view illustrating a configuration of internal electrodes of the multilayer chip capacitor as shown in FIG. 15.

Referring to FIGS. 15 to 17, the multilayer chip capacitor 200 includes 10 external electrodes 231 to 238, 241 and 242 formed in a side surface of the capacitor body 210 (10-terminal capacitor). More particularly, the first external electrodes 231, 233, 235 to 237 and the second external electrodes 232, 234, 236 and 238 are alternately disposed in each of the facing first and second side surfaces of the capacitor body 210. The first external electrodes 231, 233, 235 and 237 show the same one polarity, and the second external electrodes 232, 234, 236 and 238 show the same other polarity. Also, the third external electrode 241 and the fourth external electrode 242 are disposed in the facing third and fourth side surfaces of the capacitor body 210. The third external electrode 241 has the same polarity as the first external electrodes 231, 233, 235 and 237, and the fourth external electrode 242 has the same polarity as the second external electrodes 232, 234, 236 and 238.

Referring to FIGS. 16 and 17, the capacitor body 210 includes a first capacitor unit CR1a and CR1b: CR1 disposed along a lamination direction (z-axis direction), and a second capacitor unit CR2. The first capacitor unit CR1 includes first internal electrodes 221, 223 and 225 and second internal electrodes 222, 224 and 226, all of which are alternately disposed while being isolated in the dielectric layers 211. The second capacitor unit CR2 includes third and fourth internal electrodes 227 and 228, both of which are alternately disposed while being isolated in the dielectric layers 211. As shown in FIG. 17, the first capacitor unit CR1 forms one block by sequentially disposing 6 internal electrodes 221 to 226 along a lamination direction. This block may also be repeatedly stacked along the lamination direction.

For the first capacitor unit CR1, each of the internal electrodes 211 to 226 includes two leads 221a and 221b, 222a and 222b, 223a and 223b, 224a and 224b, 225a and 225b, or 226a and 226b. The first internal electrode 221 is coupled to the first external electrodes 231 and 237 through the two leads 221a and 221b, the second internal electrode 222 is coupled to the second external electrodes 232 and 236 through the two leads 222a and 222b, the first internal electrode 223 is coupled to the first external electrodes 233 and 235 through the two leads 223a and 223b, the second internal electrode 224 is coupled to the second external electrodes 234 and 236 through the two leads 224a and 224b, the first internal electrode 225 is coupled to the first external electrodes 233 and 237 through the two leads 225a and 225b, and the second internal electrode 226 is coupled to the second external electrode 232 and 238 through the two leads 226a and 226b.

For the second capacitor unit CR2, each of the internal electrodes 227 and 228 includes one lead 227a or 228a. The third internal electrode 227 is coupled to the third external electrode 241 through the lead 227a, and the fourth internal electrode 228 is coupled to the fourth external electrode 242 through the lead 228a.

For the first capacitor unit CR1, the internal electrodes having the same polarity are coupled to each other through the external electrodes, but the first capacitor unit CR1 and the second capacitor unit CR2 are electrically isolated from each other in the multilayer chip capacitor 200. That is to say, the first capacitor unit CR1 and the second capacitor unit CR2 are not electrically coupled to each other prior to their mounting on the circuit board.

According to the configuration of the internal electrodes in the above-mentioned first capacitor unit CR1, for the first capacitor unit CR1, the internal electrodes having the same polarity are all electrically coupled through the external electrodes. That is to say, a first internal electrode 221 with first polarity (for example, positive (+) polarity) is coupled to the first internal electrode 225 through the lead 221b and the first external electrode 237, and the first internal electrode 225 is coupled to the first internal electrode 223 through the lead 225a and the first external electrode 233. Therefore, all of the first internal electrodes 221, 223 and 225 with the first polarity are electrically coupled to each other in the capacitor. Also, a first electrode 222 with second polarity (for example, negative (−) polarity) is electrically coupled to the second internal electrode 226 through the lead 222a and the external electrode 232, and also electrically coupled to the second internal electrode 224 through the lead 222b and the external electrode 236. Therefore, all of the second internal electrodes 222, 224 and 226 with the second polarity are electrically coupled to each other in the capacitor. The fact that the internal electrodes with the same polarity are electrically coupled to each other in the capacitor (without any of electrode pads or external connecting means in the external substrate) provides an advantage to facilitate inspection of the capacitance after the manufacture of the capacitor.

As shown in FIG. 17, for the first capacitor unit CR1, leads (for example, leads 221a and 221b and leads 222a and 222b) of the internal electrodes with different polarities, which are disposed adjacent to each other in a lamination direction (z-axis direction), are always disposed adjacent to each other. Therefore, it is possible to minimize the ESL of the first capacitor unit CR1.

In this exemplary embodiment, the capacitance (C1), ESL (L1) and ESR (R1) of the first capacitor unit CR1 satisfies the relations of C1<C2, L1<L2, R1>R2 in relation to the capacitance (C2), ESL (L2) and ESR (R2) of the second capacitor unit CR2, as shown in the above-mentioned embodiment (the number of the stacked internal electrodes in the second capacitor unit CR2 is higher as much as the number of the stacked internal electrodes in the first capacitor unit CR1). To satisfy the relation of L1<L2, a distance (distance in the y-axis direction as shown in FIG. 15) between two facing side surfaces in which the first and second external electrodes 231 to 238 are formed is preferably shorter than a distance (distance in the x-axis direction) between two facing side surfaces in which the third and fourth external electrodes 241 and 242.

As shown in FIG. 16, the first capacitor units CR1a and CR1b are disposed in both lower and upper ends of the capacitor body 210 in a lamination direction, and the second capacitor unit CR2 is disposed between the lower and upper ends of the capacitor body 210 to ensure the upper and lower symmetry, but the present invention is not particularly limited thereto. As shown in FIG. 16, the first capacitor unit CR1a may be formed in one end of the capacitor body 210, but the first capacitor unit CR1b may be omitted from the other end of the capacitor body 210 (see FIG. 12). However, when the first capacitor unit CR1b is omitted, the first capacitor unit CR1a having relatively lower ESL is disposed adjacent to a mounting surface of the circuit board.

Figure 18:
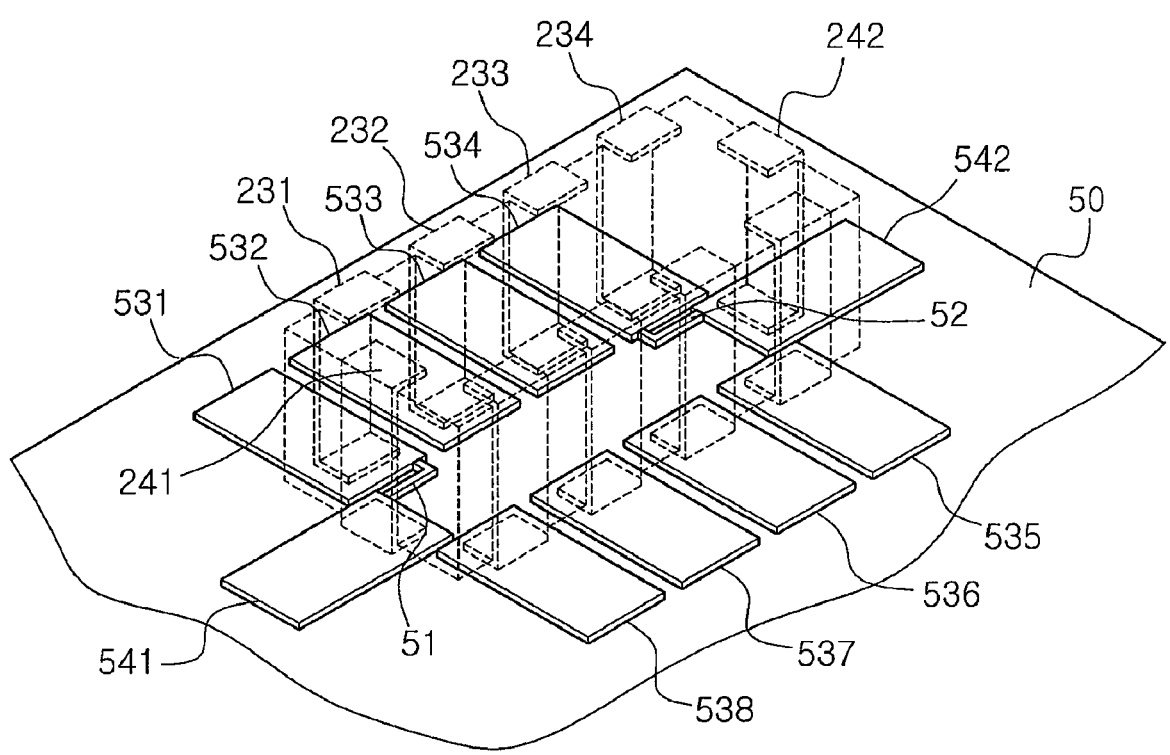
FIG. 18 is a perspective view illustrating a circuit board apparatus in which the multilayer chip capacitor as shown in FIG. 15 is mounted in the circuit board.

FIG. 18 is a perspective view illustrating a circuit board apparatus in which the multilayer chip capacitor 200 as shown in FIG. 15 is mounted in the circuit board 50. Referring to FIG. 18, a plurality of first pads 531, 533, 535 and 537, a plurality of second pads 532, 534, 536 and 538, a third pad 541 and a fourth pad 542 are formed in a mounting surface of the circuit board 50.

The capacitor 200 is disposed on the mounting surface so that the first capacitor unit CR1 having lower ESL than that of the second capacitor unit CR2 can be disposed adjacent to the mounting surface of the circuit board 50. The first pads 531, 533, 535 and 537 of the circuit board 50 are connected to the first external electrodes 231, 233, 235 and 237 of the capacitor, the second pads 532, 534, 536 and 538 are connected to the second external electrodes 232, 234, 236 and 238, the third pad 541 is connected to the third external electrode 241, and the fourth pad 542 is connected to the fourth external electrode 242. The first pad 531 and the third pad 541 are coupled to each other by the first coupling conductor line 51, and the second pad 532 and the fourth pad 542 are coupled to each other by the second coupling conductor line 52. Therefore, the first capacitor unit CR1 and the second capacitor unit CR2 are coupled in parallel to each other.

Figure 21:
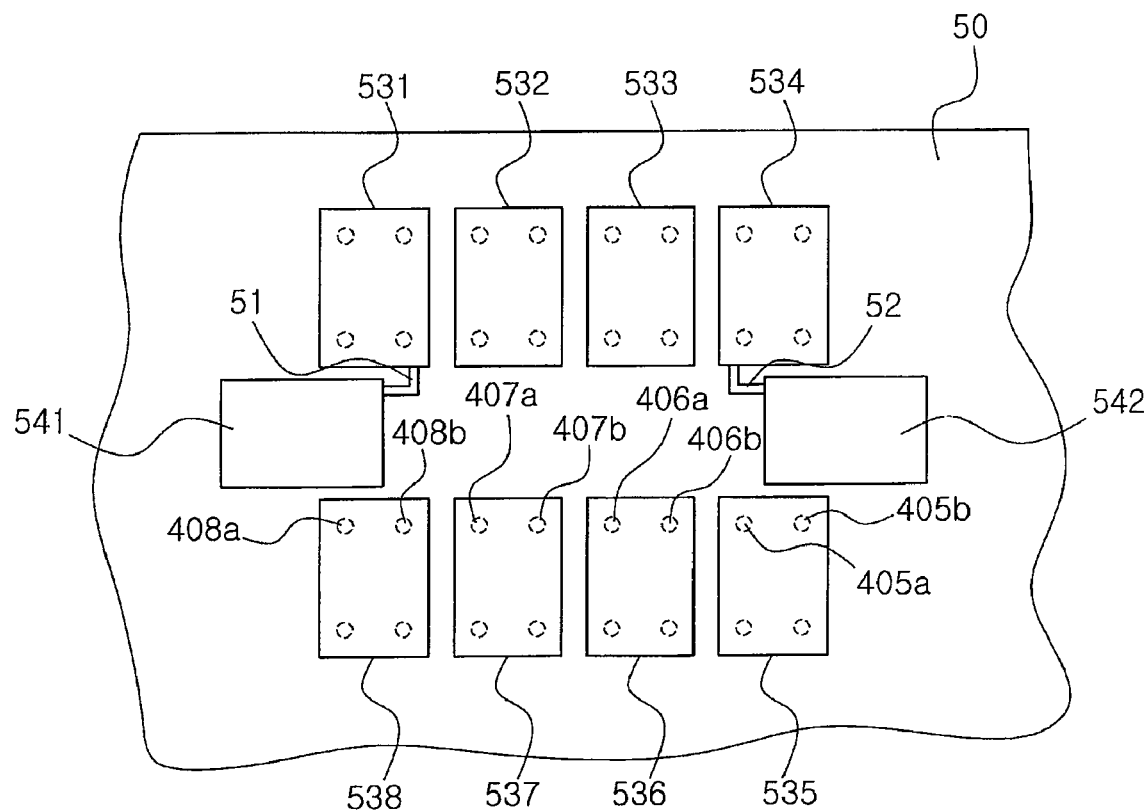
FIG. 21 is a schematic plane view illustrating the circuit board as shown in FIG. 18.

The first and second pads 531 to 538 a redirectly coupled to external circuits of the circuit board 50, but the third and fourth pads 541 and 542 are not directly coupled to the external circuits but coupled to the external circuit through the coupling conductor lines 51 and 52 and the first and second pads 531 to 538 (see FIG. 21). As a result, the second capacitor unit CR2 is coupled to the external circuits through the first and second pads 531 and 534. The coupling conductor lines 51 and 52 functions to couple the first and second capacitor units (CR1, CR2) in parallel through the connection between the pads, and also have the substantially same function as to control ESR of the second capacitor unit by adding resistances in series to the second capacitor unit CR2.

Figure 19:
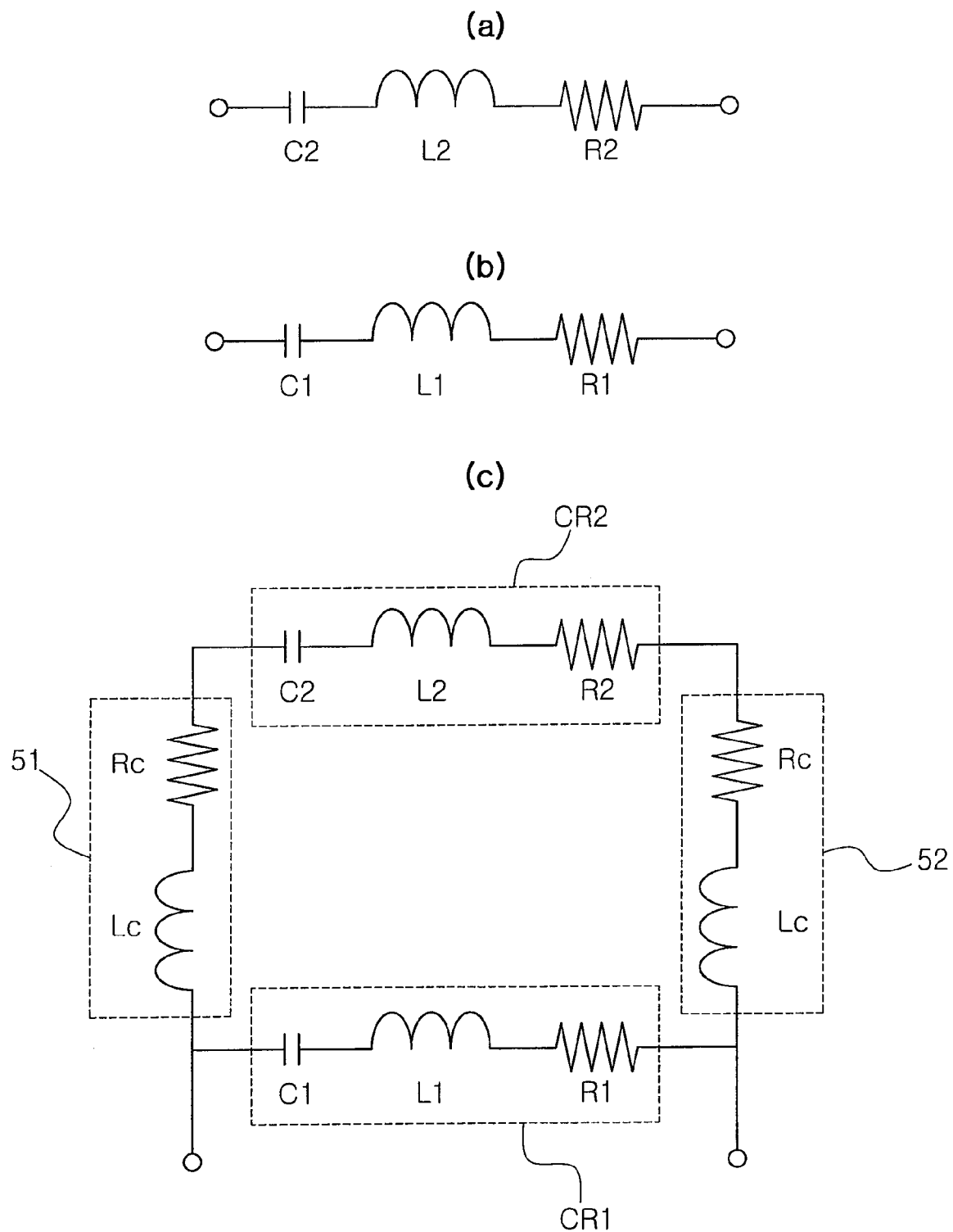
FIG. 19 is an equivalent circuit view illustrating a first capacitor unit (a), a second capacitor unit (b) and a multilayer chip capacitor (c), which is mounted in the circuit board, in the circuit board apparatus as shown in FIG. 18.

FIG. 19 is an equivalent circuit view illustrating a first capacitor unit (a), a second capacitor unit (b) and a multilayer chip capacitor (c), which is mounted in a mounting surface of the circuit board, in the circuit board apparatus 50 and 100 of FIG. 18 where the capacitor 200 is mounted on the circuit board 50. As shown in FIGS. 19(a) and (b), an equivalent circuit of the first capacitor unit CR1 in the capacitor 200 is represented by a series circuit of capacitance (C1), inductance (L1) and resistance (R1), and an equivalent circuit of the second capacitor unit CR2 is also represented by a series circuit of capacitance (C2), inductance (L2) and resistance (R2) in the same manner as the equivalent circuit of the first capacitor unit CR1 (C1<C2, L1<L2, R1>R2).

Since the first and second capacitor units CR1 and CR2 are coupled in parallel to each other through the coupling conductor lines 51 and 52 and terminals of the external circuits are connected to the first capacitor CR1, the resistances Rc and inductances Lc of the first capacitor CR1 are directly added in series to the resistance R2 and inductance L2 of the second capacitor unit CR2, as shown in FIG. 19(c), and the series circuit units 51, CR2 and 52 are coupled in parallel to the equivalent circuit units C1–L1–R1 of the first capacitor unit CR1. FIG. 19(c) shows that the first coupling conductor line 51 and the second coupling conductor line 52 have the same resistance (Rc) and inductance (Lc), but the coupling conductor lines 51 and 52 may have different resistances or inductances.

Figure 20:
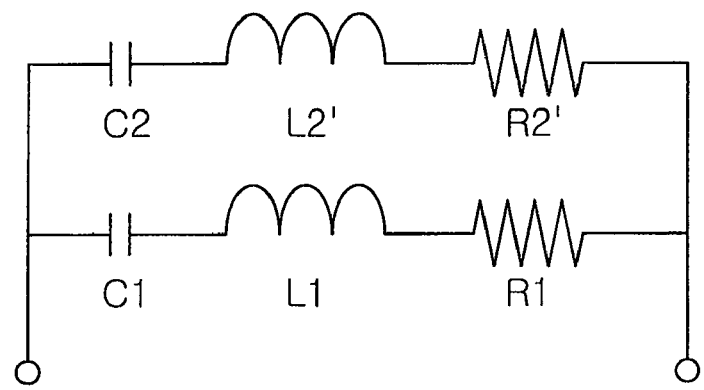
FIG. 20 is an equivalent circuit view illustrating the multilayer chip capacitor (c) as shown in FIG. 18 more simply.

The equivalent circuit of FIG. 19(c) may be described in more brief as shown in FIG. 20. In FIG. 20, the relation of L2' and R2' is represented by the Equation 1 (L2'=L2+2Lc, R2'=R2+2Rc). Therefore, the second capacitor unit CR2 has such effect that the ESR of the second capacitor unit CR2 is substantially increased by the addition of the resistances 2Rc of the coupling conductor lines 51 and 52. As a result, like the previous exemplary embodiments of the present invention, it is possible to maintain a low ESL of the entire capacitor in the high frequency band, as well as to implement constant impedance in the wide frequency band in this exemplary embodiment.

Figure 22:
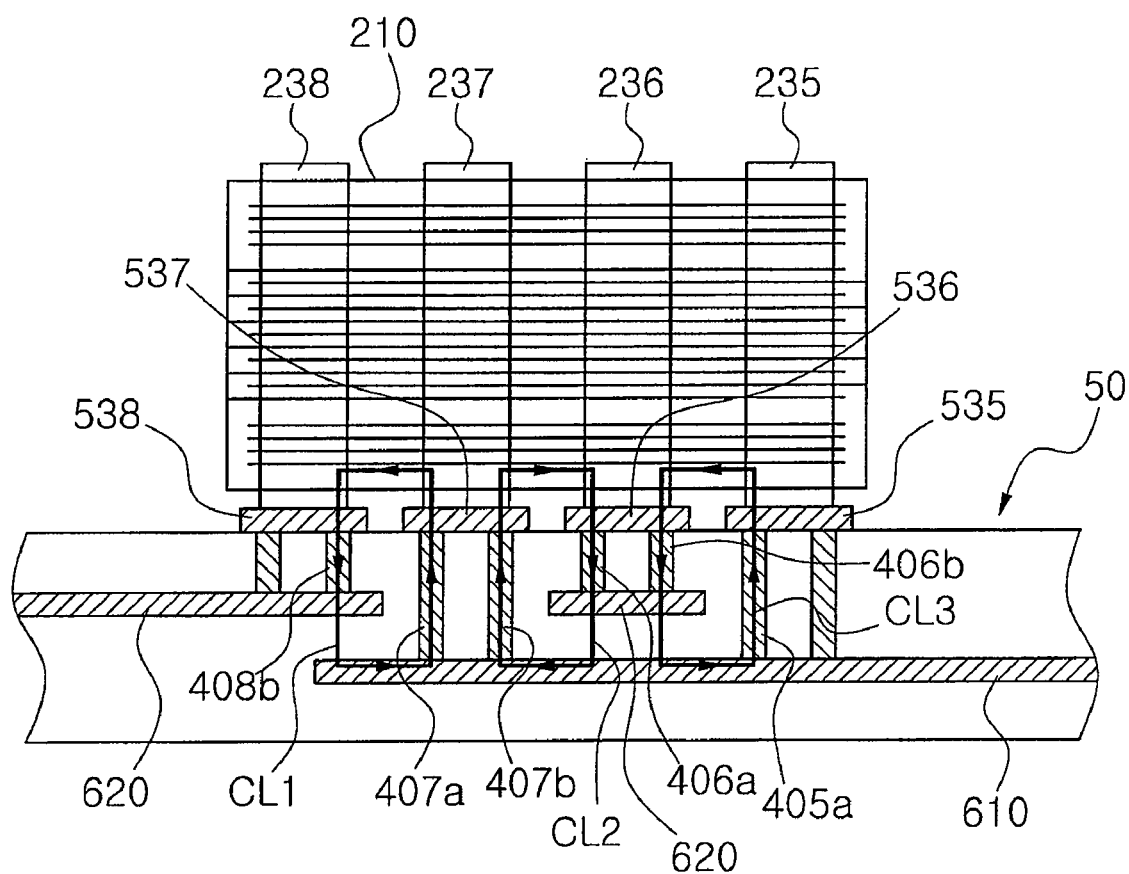
FIG. 22 is a side cross-sectional view illustrating the circuit board apparatus as shown in FIG. 18.

FIG. 21 is a schematic plane view illustrating a circuit board as shown in FIG. 18, and FIG. 22 is a side cross-sectional view illustrating a circuit board apparatus as shown in FIG. 18. Referring to FIGS. 21 and 22, mounting pads 531 to 538, 541 and 542 are disposed on the substrate 50, and first and second coupling conductor lines 51 and 52 for coupling the mounting pads are formed in the substrate 50. Vias 405a, 405b, 406a, 406b, 407a, 407b, 408a and 408b are formed as parts of the external circuit (for example, a circuit for applying a power voltage to a decoupling capacitor) in the circuit board 50. Here, the vias are connected only to the first and second pads 531 to 538 that are coupled to the first capacitor unit. Two or more vias are connected to each of the first and second pads 531 to 538, and current loops CL2 are formed through the vias.

Examples 3 and 4

Figure 23:
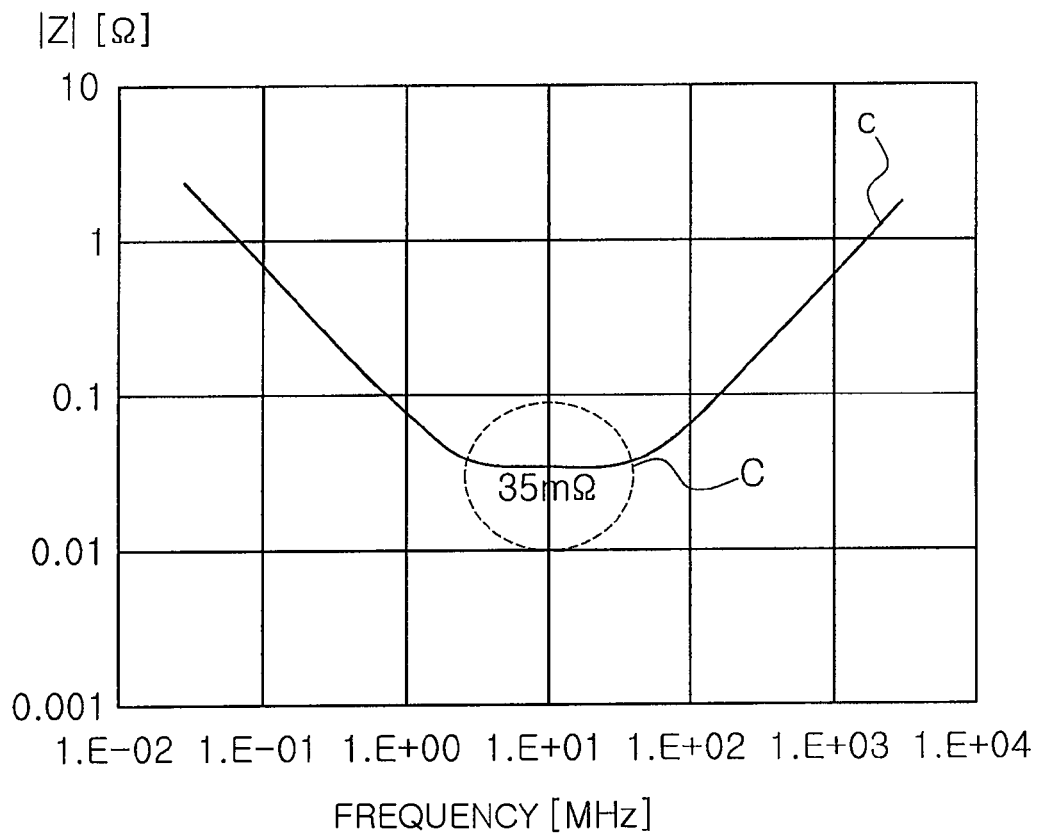
FIG. 23 is a graph illustrating frequency vs. impedance characteristics of the multilayer chip capacitor according to one exemplary embodiment of the present invention.

FIG. 23 is a graph illustrating frequency vs. impedance (f-z) characteristics of the multilayer chip capacitor according to one exemplary embodiment of the present invention. The graph of FIG. 23 shows the results of measuring frequency-impedance of samples having the capacitor and the circuit board apparatus according to the exemplary embodiments of FIGS. 15 to 18.

Particularly, a sample of Example 3 as shown in FIG. 23 conforms to a multilayer chip capacitor with 1608 size and 10 terminals having 2.2 μF capacitance. The capacitance of the first capacitor unit is 0.4 μF, and the capacitance of the second capacitor unit is 1.8 μF. Also, the ESL and ESR of the first capacitor unit are 110 pH and 43 mΩ, respectively, and the actual ESL and ESR (L2', R2' as shown in FIG. 18) of the second capacitor unit to which the coupling conductor lines are added in series are 700 pH and 46 mΩ, respectively.

As the results of measuring the frequency-impedance of the above-mentioned sample of Example 3, it is shown that an impedance curve (c) is flat in a frequency region (region C) around the resonance frequency (a constant impedance of about 35 mΩ in the flat portion), as shown in FIG. 23. This indicates that the impedance has a constant value in a relatively wider frequency band without the radical changes in the impedance. The impedance characteristics of the sample of Example 3 are more clearly shown through the comparison of a frequency-impedance curve (see FIG. 24) with the sample of Comparative example.

Figure 24:
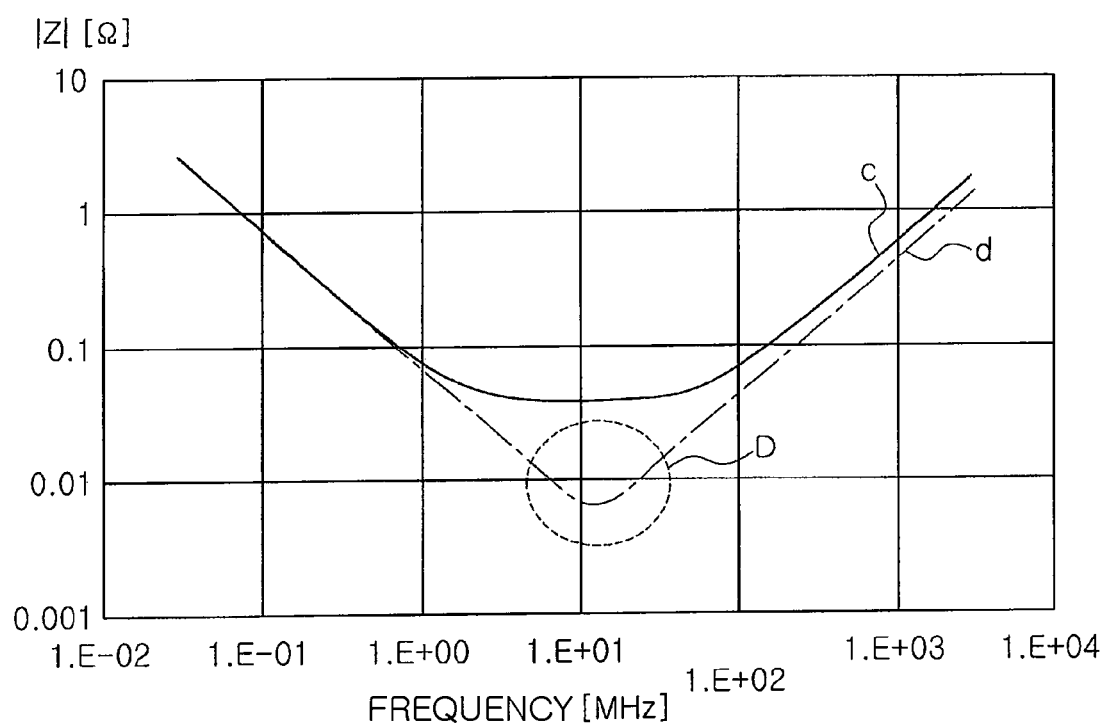
FIG. 24 is a graph illustrating the results obtained by comparing the frequency vs. impedance characteristics of the multilayer chip capacitors according to Example as shown in FIG. 23 and Comparative example.

FIG. 24 is a graph illustrating the results obtained by comparing the frequency vs. impedance characteristics of the multilayer chip capacitors according to Example 3 as shown in FIG. 23 and Comparative example. A curve (d) showing frequency vs. impedance characteristics of the multilayer chip capacitor of Comparative example as shown in FIG. 24 shows a result of measuring a conventional capacitor sample with 1608 size and 8 terminals having 2.2 μF capacitance. The capacitor sample of Comparative example has a repeatedly stacked configuration of different-polarity internal electrodes that have four leads without dividing the capacitors into two capacitor units. The characteristics (average ESL and the minimum impedance) of the samples of Comparative example and Example 3 are listed in the following Table 3.

TABLE 3

| Sample | ESL (Average, SRF ~3 GHz) | Min |Z| |
|---|---|---|
| Comparative example | 58 pH | 7.0 mΩ |
| Example 3 | 93 pH | 35.0 mΩ |

As shown in FIG. 24, the capacitor sample (d) of Comparative example has a pointed minimum region formed in the frequency-impedance curve since the very radical changes in impedance are caused around a resonance frequency region (region D), whereas the capacitor sample (c) of Example 3 has a flat portion around the region D. Therefore, the changes in impedance of the capacitor sample are significantly stable, compared to that of the capacitor sample of Comparative example.

Figure 25:
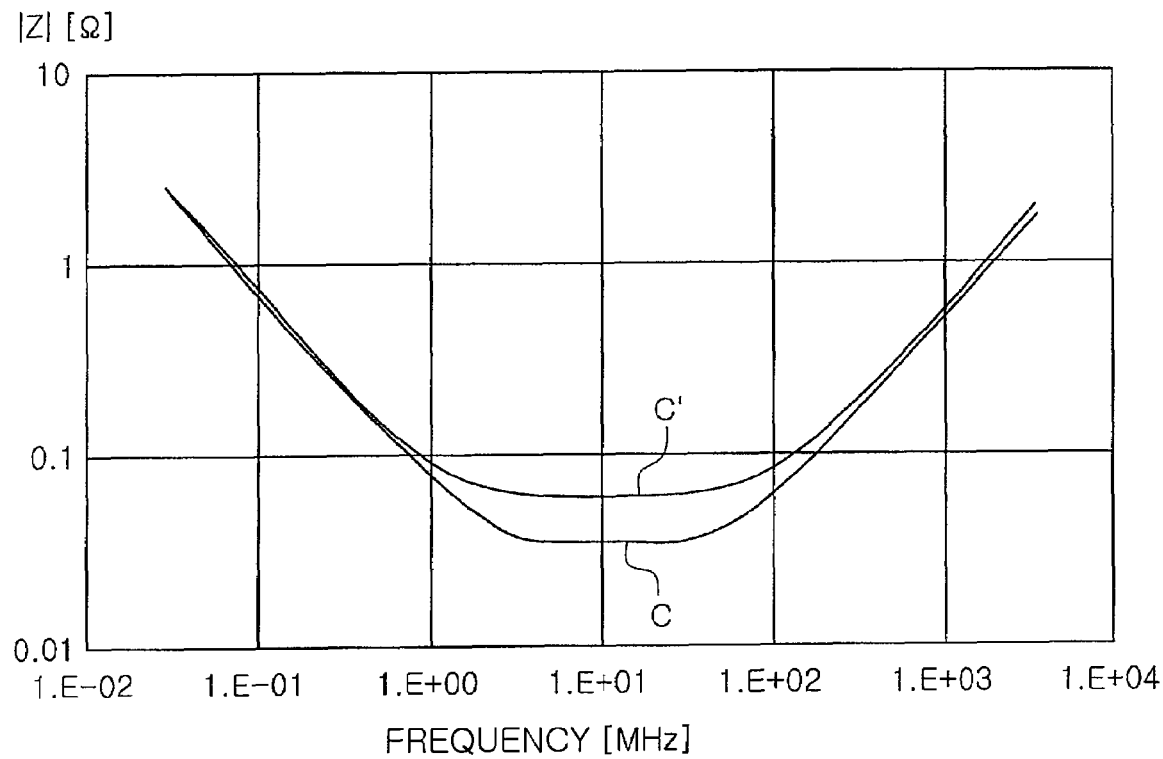
FIG. 25 is a graph illustrating the results obtained by comparing the frequency vs. impedance characteristics of the multilayer chip capacitors in two Examples.

FIG. 25 is a graph illustrating the results obtained by comparing the frequency vs. impedance characteristics of the multilayer chip capacitors in two Examples (Examples 3 and 4). In FIG. 25, a curve (c) represents a sample of Example 3 as shown above in FIG. 23, and a curve (c') represents a sample of Example 4. Like the capacitor sample of Example 3, the sample of Example 4 is a multilayer chip capacitor with 1608 size and 10 terminals having 2.2 μF capacitance, and conforms to the capacitor and the circuit board apparatus as shown in FIGS. 15 to 18. There is a difference in characteristics of the capacitor samples of Examples 3 and 4 under the control of the number of the stacked internal electrodes or the inductance and resistance of the coupling conductor lines, as listed in the following Table 4.

TABLE 4

| Samples | ESL (Average, SRF ~3 GHz) | Min |Z| |
|---|---|---|
| Example 4 | 104 pH | 59.6 mΩ |
| Example 3 | 93 pH | 35.0 mΩ |

As shown in FIG. 25 and Table 4, the capacitor sample of Example 4 has higher minimum impedance than the capacitor sample of Example 3.

Figure 26:
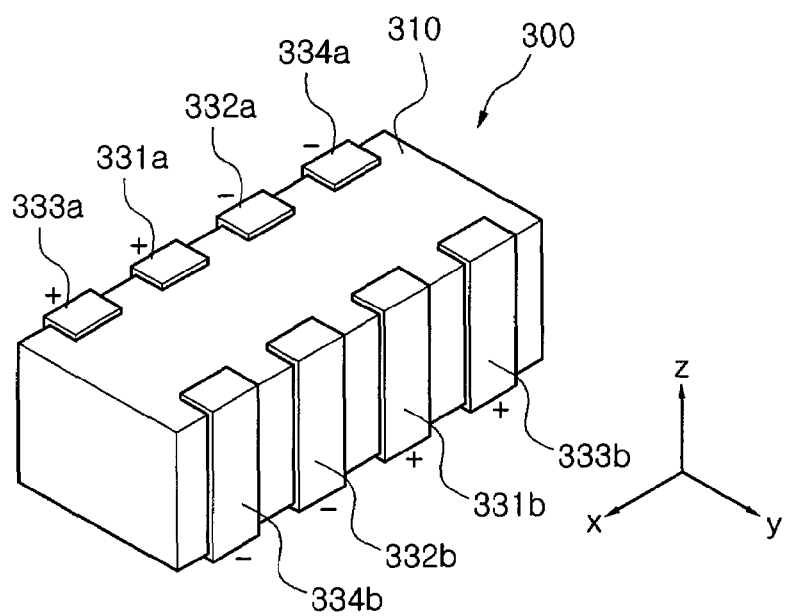
FIG. 26 is a perspective view illustrating an appearance of a multilayer chip capacitor according to still another exemplary embodiment of the present invention.
Figure 27:
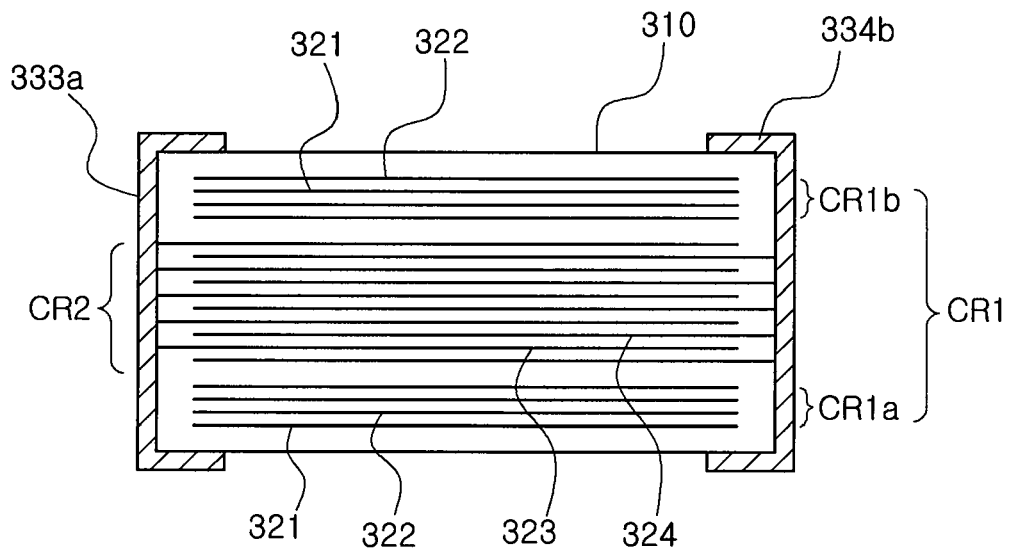
FIG. 27 is a side cross-sectional view taken from a line that is parallel to the x axis of the multilayer chip capacitor as shown in FIG. 26.
Figure 28:
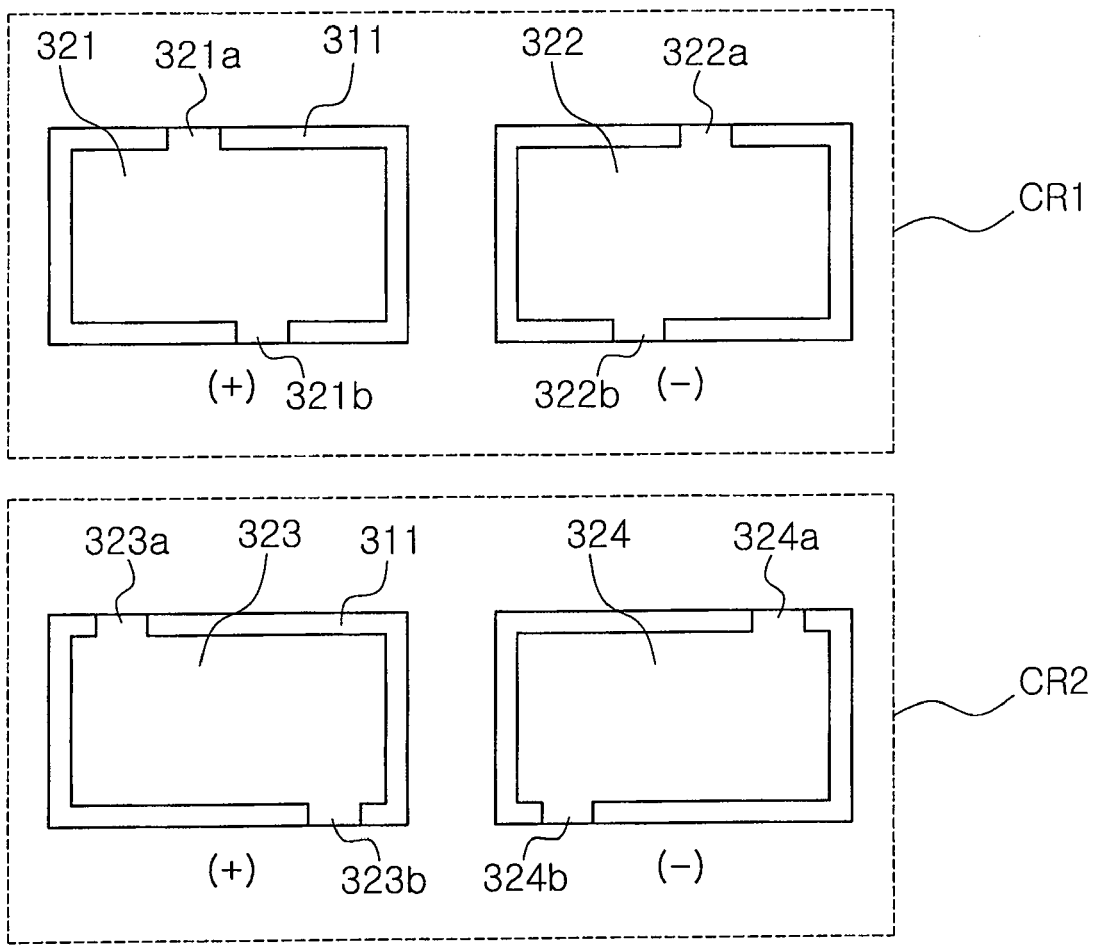
FIG. 28 is a plane view illustrating a configuration of internal electrodes of the multilayer chip capacitor as shown in FIG. 26.

FIG. 26 is a perspective view illustrating an appearance of a multilayer chip capacitor according to still another exemplary embodiment of the present invention, FIG. 27 is a side cross-sectional view taken from a line that is parallel to the x axis of the multilayer chip capacitor as shown in FIG. 26, and FIG. 28 is a plane view illustrating a configuration of internal electrodes of the multilayer chip capacitor as shown in FIG. 26. In this exemplary embodiment, external electrodes coupled to two capacitor units are disposed in all facing first and second side surfaces.

Referring to FIG. 26, the multilayer chip capacitor 300 includes the total 8 external electrodes 331a, 331b, 332a, 332b, 333a, 333b, 334a and 334b. The first external electrodes 331a and 331b with one polarity and the second external electrodes 332a and 332b with the other polarity are disposed in facing first and second side surfaces of the capacitor body 310. Also, the third external electrodes 333a and 333b with one polarity and the fourth external electrodes 334a and 334b with the other polarity are disposed in the facing first and second side surfaces of the capacitor body 310. The first and third external electrodes 331a, 331b, 333a and 333b have the same polarity, and the second and fourth external electrodes 332a, 332b, 334a and 334b have the same polarity.

Referring to FIGS. 27 and 28, the capacitor body 310 includes a first capacitor unit CR1a and CR1b: CR1 and a second capacitor unit CR2, both of which are disposed in a lamination direction (z-axis direction). The first capacitor unit CR1 includes first and second internal electrodes 321 and 322, all of which are alternately disposed while being isolated in the dielectric layers 311. The second capacitor unit CR2 includes third and fourth internal electrodes 323 and 324, all of which are alternately disposed while being isolated in the dielectric layer 311.

For the first capacitor unit CR1, the first internal electrode 321 is coupled to the first external electrodes 331a and 331b through two leads 321a and 321b, and the second internal electrode 322 is coupled to the second external electrodes 332a and 332b through two leads 322a and 322b. For the first capacitor unit CR1, leads (i.e., leads 321a and 321b, and leads 322a and 322b) of the internal electrodes with different polarities, which are disposed adjacent to each other in a lamination direction (z-axis direction), are always disposed adjacent to each other, as shown in FIG. 28. Therefore, it is possible to reduce ESL of the first capacitor unit. For the second capacitor unit CR2, the third internal electrode 323 is coupled to the third external electrodes 333a and 333b through two leads 323a and 323b, and the fourth internal electrode 324 is coupled to the fourth external electrodes 334a and 334b through two leads 324a and 324b. According to the above-mentioned connection architecture of the internal electrodes and the external electrodes, the first capacitor unit CR1 and the second capacitor unit CR2 are electrically isolated from each other in the multilayer chip capacitor 300.

Also in this exemplary embodiment, the capacitance (C1), ESL (L1) and ESR (R1) of the first capacitor unit CR1 satisfies the relations of C1<C2, L1<L2, R1>R2 in relation to the capacitance (C2), ESL (L2) and ESR (R2) of the second capacitor unit CR2. The first capacitor units CR1a and CR1b are disposed in both upper and lower ends of the capacitor body 310 in a lamination direction, and the second capacitor unit CR2 is disposed between the lower and upper ends of the capacitor body 310 to ensure the upper and lower symmetry (see FIG. 27), but the present invention is not particularly limited thereto. In FIG. 27, the first capacitor unit CR1a may be formed in only one end of the capacitor body 310, but the first capacitor unit CR1b may be omitted from the other end of the capacitor body 310. In this case, the first capacitor unit CR1a having relatively lower ESL is disposed adjacent to a mounting surface of the circuit board.

Figure 29:
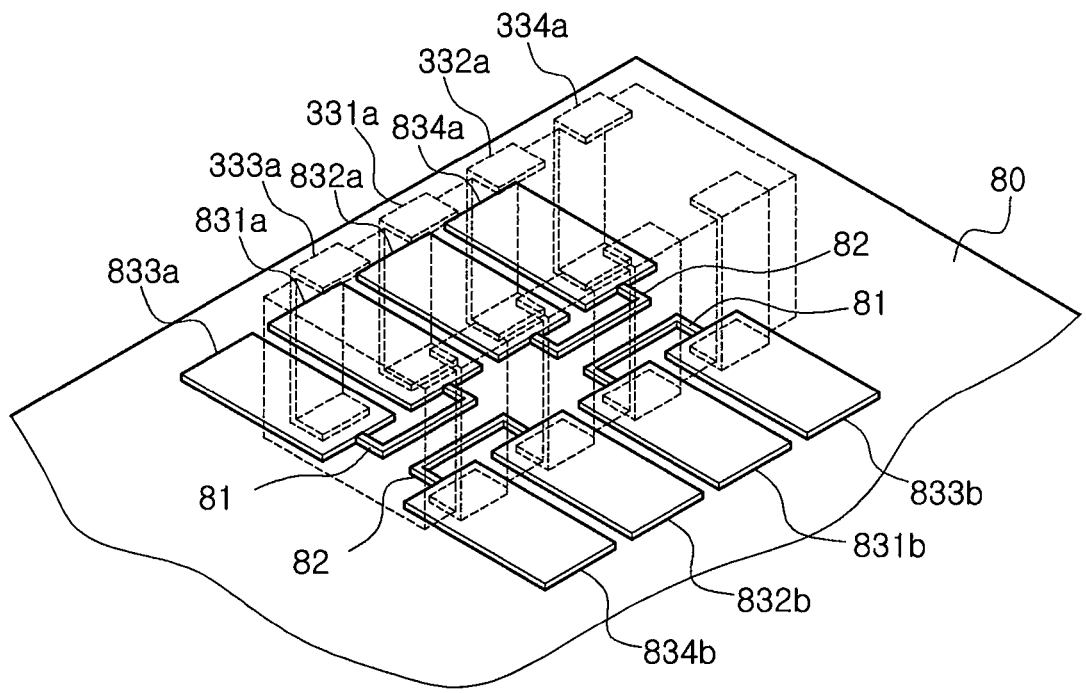
FIG. 29 is a perspective view illustrating a circuit board apparatus in which the multilayer chip capacitor as shown in FIG. 26 is mounted in the circuit board.

FIG. 29 is a perspective view illustrating a circuit board apparatus in which the capacitor 300 of FIG. 26 is mounted on the circuit board 80. Referring to FIG. 29, first pads 831a and 831b, second pads 832a and 832b, third pads 833a and 833b, and fourth pads 834a and 834b are formed in the mounting surface of the circuit board 80.

The capacitor 300 is disposed on the mounting surface of the circuit board 80 so that the first capacitor unit CR1 having relatively lower ESL can be disposed adjacent to the mounting surface of the circuit board 80. The first pads 831a and 831b of the circuit board 80 are connected to the first external electrodes 331a and 331b of the capacitor, the second pads 832a and 832b are connected to the second external electrodes 332a and 332b, the third pads 833a and 833b are connected to the third external electrodes 333a and 333b, and the fourth pads 834a and 834b are connected to the fourth external electrodes 334a and 334b. Therefore, the first pad and the third pad have the same polarity, and the second pad and the fourth pad have the same polarity.

The first pads 831a and 831b with one polarity are coupled respectively to the third pads 833a and 833b with one polarity by means of the first coupling conductor line 81, and the second pads 832a and 832b with the other polarity are coupled respectively to the fourth pads 834a and 834b with the other polarity by means of the first coupling conductor line 82. Therefore, the first capacitor unit CR1 and the second capacitor unit CR2 are coupled in parallel to each other. However, one of the two first coupling conductor lines 81 may be omitted, when necessary, or one of the tow second coupling conductor lines 82 may also be omitted, when necessary. Also, only the coupling conductor line (for example, 81) with one polarity may be present by omitting one coupling conductor line with the one polarity from the two coupling conductor lines 81 and 82 having the different polarities (In this case, pads that are not coupled to the coupling conductor line may be directly connected to the external circuits (for example, vias)).

Figure 30:
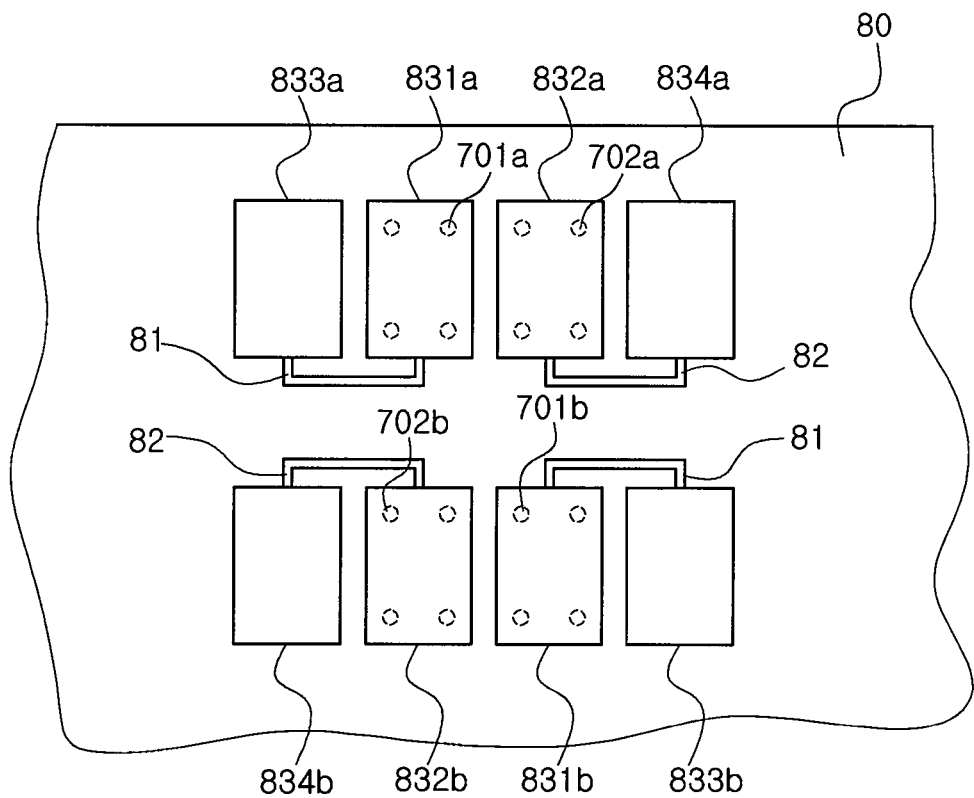
FIG. 30 is a schematic plane view illustrating the circuit board as shown in FIG. 29.

The first and second pads 831a, 831b, 832a and 832b are directly coupled to the external circuits of the circuit board 80, but the third and fourth pads 833a, 833b, 834a and 834b are not directly coupled to the external circuits but coupled to the external circuits (for example, vias) through the coupling conductor lines 81 and 82 and the first and second pads 831a to 832b (see FIG. 30). As a result, the second capacitor unit CR2 is coupled to the external circuits through the first and second pads 831a, 831b, 832a and 832b. The coupling conductor lines 81 and 82 function to couple the first and second capacitor units CR1 and CR2 in parallel to each other, and also have the substantially same function as to control ESR of the second capacitor unit by adding resistances in series to the second capacitor unit CR2.

FIG. 30 is a schematic plane view illustrating the circuit board as shown in FIG. 29. Referring to FIG. 30, mounting pads 831a to 834b are disposed on the substrate 80, and first and second coupling conductor lines 81 and 82 for coupling the mounting pads are formed in the substrate 80. Vias 701a, 701b, 702a and 702b are formed as parts of the external circuit in the circuit board 80. Here, the vias are connected only to the first and second pads 831a, 831b, 832a and 832b coupled to the first capacitor unit. Two or more vias are connected to each of the first and second pads 831a, 831b, 832a and 832b.

Figure 31:
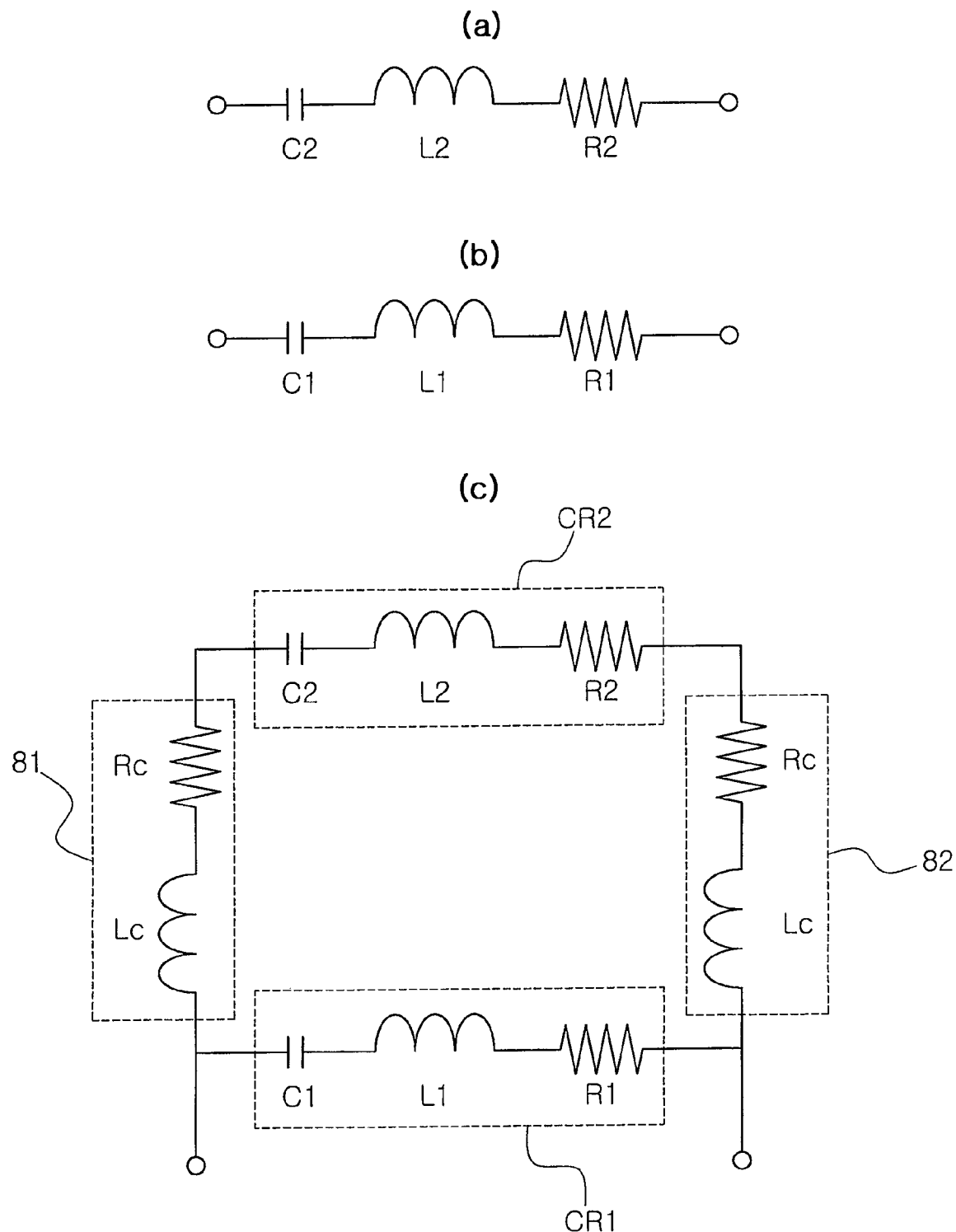
FIG. 31 is an equivalent circuit view illustrating a first capacitor unit (a), a second capacitor unit (b) and a multilayer chip capacitor (c), which is mounted in the circuit board, in the circuit board apparatus as shown in FIG. 29.

FIG. 31 is an equivalent circuit view illustrating a first capacitor unit (a), a second capacitor unit (b) and a multilayer chip capacitor (c), which is mounted on a mounting surface of the circuit board 80, in the circuit board apparatus 80 and 300 of FIG. 29 where the capacitor 300 is mounted on the circuit board 80. A shown in FIGS. 31(a) and (b), an equivalent circuit of the first capacitor unit CR1 in the capacitor 300 is represented by a series circuit of capacitance (C1), inductance (L1) and resistance (R1), and an equivalent circuit of the second capacitor unit CR2 is also represented by a series circuit of capacitance (C2), inductance (L2) and resistance (R2) in the same manner as the equivalent circuit of the first capacitor unit CR1 (C1<C2, L1<L2, R1>R2).

Figure 32:
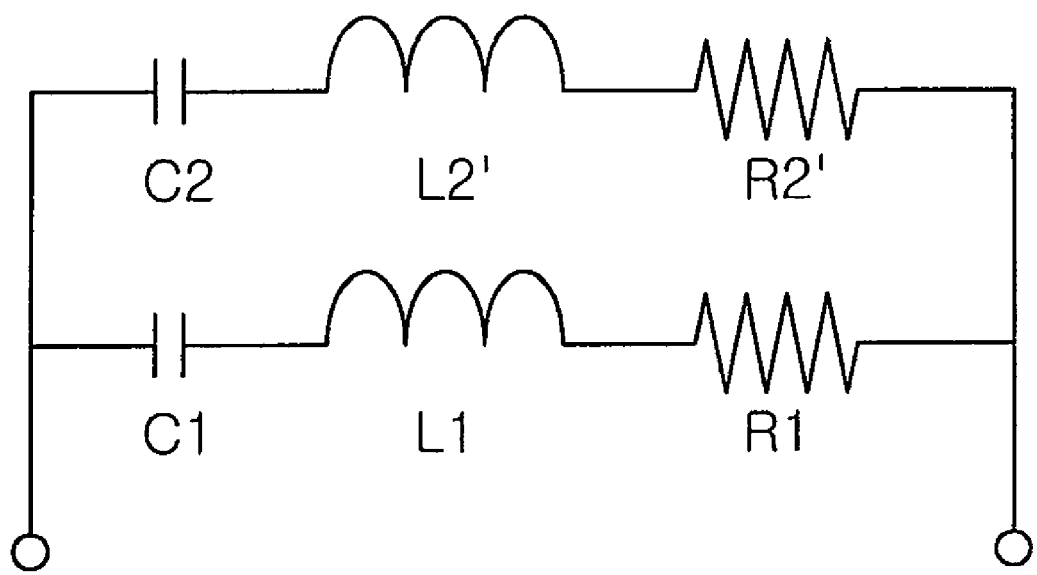
FIG. 32 is an equivalent circuit view illustrating the multilayer chip capacitor (c) as shown in FIG. 31 more simply.

As shown in FIG. 31(c), the resistances (Rc) and inductances (Lc) of the first and second coupling conductor lines 81 and 82 are directly added in series to the resistance (R2) and inductance (L2) of the second capacitor unit CR2, and the series circuit units 81, CR2 and 82 are coupled in parallel to the equivalent circuit units (C1–L1–R1) of the first capacitor unit CR1. Unlike as shown in FIG. 31(c), each of the coupling conductor lines 81 and 82 may have different resistance or inductance. The equivalent circuit of FIG. 31(c) may be described in more brief as shown in FIG. 32 (L2'=L2+2Lc, R2'=R2+2Rc). Therefore, the second capacitor unit CR2 has such effect that the ESR of the second capacitor unit CR2 is substantially increased by the addition of the resistances 2Rc of the coupling conductor line 81 and 82. As a result, it is possible to maintain a low ESL of the entire capacitor in the high frequency band, as well as to implement constant impedance in the wide frequency band in this exemplary embodiment.

The multilayer chip capacitor according to the present invention may be useful to achieve a low equivalent series inductance (ESL) and maintain a suitable equivalent series resistance (ESR) without any change of materials thereof. Also, the multilayer chip capacitor according to the present invention may be useful to maintain the impedance of the power distribution network within the wide frequency ranges to a low and constant level when the decoupling capacitor is used as the multilayer chip capacitor. Therefore, it is possible to manufacture the decoupling capacitor whose ESR is high and controllable and ESL is low.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer chip capacitor comprising a capacitor body having a multilayer structure where a plurality of dielectric layers are stacked; and a plurality of external electrodes formed on a side surface of the capacitor body,
   wherein the capacitor body includes a first capacitor unit and a second capacitor unit, all of which are arranged along a lamination direction,
   wherein the first capacitor unit includes at least a pair of first and second internal electrodes (the first and second internal electrodes have different polarities), all of which are alternately disposed in the inside of the capacitor body to face each other while being isolated in the dielectric layers,
   wherein the second capacitor unit includes a plurality of third and fourth internal electrodes (the third and fourth internal electrodes have different polarities), all of which are alternately disposed in the inside of the capacitor body to face each other while being isolated in the dielectric layers,
   wherein a plurality of the external electrodes include at least one first external electrode coupled to the first internal electrode, at least one second external electrode coupled to the second internal electrode, at least one third external electrode coupled to the third internal electrode, and at least one fourth external electrode coupled to the fourth internal electrode, and
   wherein the first capacitor unit has a lower equivalent series inductance (ESL) than the second capacitor unit, and the first capacitor unit has a higher equivalent series resistance (ESR) than the second capacitor unit.

2. The multilayer chip capacitor of claim 1, wherein the first capacitor unit is disposed in at least one end thereof in the lamination direction.

3. The multilayer chip capacitor of claim 2, wherein the two first capacitor units are disposed in both ends thereof in the lamination direction, and the second capacitor unit is disposed between the two first capacitor units.

4. The multilayer chip capacitor of claim 3, wherein the first capacitor units disposed in the both ends thereof are disposed symmetrically to each other, and the multilayer chip capacitor has upper and lower symmetry.

5. The multilayer chip capacitor of claim 1, wherein the total number of the stacked third and fourth internal electrodes in the second capacitor unit is higher than that of the stacked first and second internal electrodes in the first capacitor unit.

6. The multilayer chip capacitor of claim 1, wherein the first capacitor unit and the second capacitor unit are electrically isolated in the multilayer chip capacitor.

7. The multilayer chip capacitor of claim 1, wherein the first and second external electrodes are disposed in the facing first and second side surfaces of the capacitor body, the first and second internal electrodes are coupled respectively to the first and second external electrodes through leads, and the third and fourth external electrodes are disposed in two another facing side surfaces of the capacitor body.

8. The multilayer chip capacitor of claim 7, wherein the multilayer chip capacitor is a 4-terminal capacitor including one first external electrode, one second external electrode, one third external electrode and one fourth external electrode.

9. The multilayer chip capacitor of claim 7, wherein a distance between the first and second side surfaces of the capacitor body is smaller than that between the third and fourth side surfaces.

10. The multilayer chip capacitor of claim 1, wherein a plurality of the first and second external electrodes are alternately disposed in the facing first and second side surfaces of the capacitor body, the first and second internal electrodes are coupled respectively to the first and second external electrodes through leads, and the third and fourth external electrodes are disposed in another two facing side surfaces of the capacitor body.

11. The multilayer chip capacitor of claim 10, wherein the first and second internal electrodes are coupled respectively to the first and second external electrodes through two leads in the case of the first capacitor unit, and
   wherein the third and fourth internal electrodes is coupled respectively to the third and fourth external electrodes through one lead in the case of the second capacitor unit.

12. The multilayer chip capacitor of claim 11, wherein the multilayer chip capacitor is a 10-terminal capacitor including 4 first external electrodes, 4 second external electrodes, one third external electrode and one fourth external electrode.

13. The multilayer chip capacitor of claim 10, wherein the internal electrodes having the same polarity in the first capacitor unit are all electrically coupled to the external electrodes having the same polarity in the first and second external electrodes.

14. The multilayer chip capacitor of claim 10, wherein the leads in the internal electrodes having different polarities, which are disposed adjacent to each other in a lamination direction, are disposed always adjacent to each other in the first capacitor unit when viewed in the lamination direction.

15. The multilayer chip capacitor of claim 1, wherein the first and second external electrodes are disposed in the facing first and second side surfaces of the capacitor body, the first and second internal electrodes are coupled respectively to the first and second external electrodes through leads, the third and fourth external electrodes are disposed in the first and second side surfaces, and the third and fourth internal electrodes are coupled to the third and fourth external electrodes through leads.

16. The multilayer chip capacitor of claim 15, wherein the first and second internal electrodes are coupled respectively to the first and second external electrodes through two leads in the case of the first capacitor unit, and
   wherein the third and fourth internal electrodes are coupled respectively to the third and fourth external electrodes through one lead in the case of the second capacitor unit.

17. A circuit board apparatus, comprising:
   the multilayer chip capacitor as defined in claim 1; and
   a circuit board including a mounting surface having the multilayer chip capacitor mounted therein and an external circuit electrically coupled to the multilayer chip capacitor,
   wherein a plurality of mounting pads coupled to external electrodes of the multilayer chip capacitor are formed on the mounting surface of the circuit board, and the multilayer chip capacitor is disposed so that the first capacitor unit is positioned more adjacently to the mounting surface than the second capacitor unit, wherein a plurality of the mounting pads include a first pad coupled to the first external electrode, a second pad coupled to the second external electrode, a third pad coupled to the third external electrode and a fourth pad coupled to the fourth external electrode, wherein at least one coupling conductor line that couples the third pad to the first pad or couples the fourth pad to the second pad is formed, and wherein the first and second pads are directly coupled to the external circuit, and the third or fourth pads coupled to the coupling conductor line are coupled to an external circuit through the first or second pads coupled to the coupling conductor line.

18. The circuit board apparatus of claim 17, wherein the at least one coupling conductor line includes a first coupling conductor line for coupling the third pad to the first pad, and a second coupling conductor line for coupling the fourth pad to the second pad.

19. The circuit board apparatus of claim 18, wherein the first and second pads are directly coupled to the external circuit, and the third and fourth pads are coupled to the external circuit through the first and second pads.

20. The circuit board apparatus of claim 17, wherein the first capacitor unit is coupled to the second capacitor unit by means of the coupling conductor line that couples pads having the same polarity.

21. The circuit board apparatus of claim 17, wherein the coupling conductor line is coupled in series to the second capacitor unit, and ESR of the second capacitor unit is controllable by changing the length or width of the coupling conductor line.

22. The circuit board apparatus of claim 17, wherein the second capacitor unit is coupled to the external circuit through the first and second pads.

23. The circuit board apparatus of claim 17, wherein the multilayer chip capacitor mounted in the circuit board shows impedance characteristics to have a flat portion in a frequency-impedance curve.

24. The circuit board apparatus of claim 17, wherein the vias coupled to the first and second pads are formed as parts of the external circuit in the inner part of the circuit board.

25. The circuit board apparatus of claim 24, wherein the vias coupled to the first pad are disposed so that the vias are adjacent to the second pad, and the vias coupled to the second pad are disposed so that the vias are adjacent to the first pad.

26. The circuit board apparatus of claim 24, wherein two or more vias are coupled respectively to the first and second pads.

27. The circuit board apparatus of claim 17, wherein the first capacitor unit is disposed in at least one end thereof in the lamination direction.

28. The circuit board apparatus of claim 27, wherein the two first capacitor units are disposed in both inside ends of the capacitor body in the lamination direction, and the second capacitor unit is disposed between the first capacitor units.

29. The circuit board apparatus of claim 28, wherein the first capacitors disposed in the both ends of the capacitor body are disposed symmetrically to each other, and the multilayer chip capacitor has upper and lower symmetry.

30. The circuit board apparatus of claim 17, wherein the total number of the stacked third and fourth internal electrodes in the second capacitor unit is higher than that of the stacked first and second internal electrodes in the first capacitor unit.

31. The circuit board apparatus of claim 17, wherein the first capacitor unit and the second capacitor unit are electrically isolated in the multilayer chip capacitor.

32. The circuit board apparatus of claim 17, wherein the first and second external electrodes are disposed in the facing first and second side surfaces of the capacitor body, the first and second internal electrodes are coupled respectively to the first and second external electrodes through leads, and the third and fourth external electrodes are disposed in another two facing side surface of the capacitor body.

33. The circuit board apparatus of claim 32, wherein the multilayer chip capacitor is a 4-terminal capacitor including one first external electrode, one second external electrode, one third external electrode and one fourth external electrode.

34. The circuit board apparatus of claim 32, wherein a distance between the first and second side surfaces of the capacitor body is smaller than that between the third and fourth side surfaces.

35. The circuit board apparatus of claim 17, wherein a plurality of the first and second external electrodes are alternately disposed in the facing first and second side surfaces of the capacitor body, the first and second internal electrodes are coupled to the first and second external electrodes through leads, and the third and fourth external electrodes are disposed in another two facing side surfaces of the capacitor body.

36. The circuit board apparatus of claim 35, wherein the first and second internal electrodes are coupled respectively to the first and second external electrodes through two leads in the case of the first capacitor unit, and wherein the third and fourth internal electrodes are coupled respectively to the third and fourth external electrodes through one lead in the case of the second capacitor unit.

37. The circuit board apparatus of claim 36, wherein the multilayer chip capacitor is a 10-terminal capacitor including 4 first external electrodes, 4 second external electrodes, one third external electrode and one fourth external electrode.

38. The circuit board apparatus of claim 35, wherein the internal electrodes having the same polarity in the first capacitor unit are all electrically coupled to the external electrodes having the same polarity in the first and second external electrodes.

39. The circuit board apparatus of claim 35, wherein the leads in the internal electrodes having different polarities, which are disposed adjacent to each other in a lamination direction, are disposed always adjacent to each other in the first capacitor unit when viewed in the lamination direction.

40. The circuit board apparatus of claim 17, wherein the first and second external electrodes are disposed in the facing first and second side surfaces of the capacitor body, the first and second internal electrodes are coupled respectively to the first and second external electrodes through leads, the third and fourth external electrodes are disposed in the first and second side surfaces, and the third and fourth internal electrodes are coupled to the third and fourth external electrodes through leads.

41. The circuit board apparatus of claim 40, wherein the first and second internal electrodes are coupled respectively to the first and second external electrodes through two leads in the case of the first capacitor unit, and wherein the third and fourth internal electrodes are coupled respectively to the third and fourth external electrodes through one lead in the case of the second capacitor unit.

42. A circuit board apparatus, comprising:
the multilayer chip capacitor as defined in claim 1;
a circuit board including a mounting surface having the multilayer chip capacitor mounted thereon; and
an external circuit electrically coupled to the multilayer chip capacitor, wherein a plurality of mounting pads coupled to the external electrode of the multilayer chip capacitor are formed on the mounting surface of the circuit board wherein a plurality of the mounting pads include a first pad coupled to the first external electrode, a second pad coupled to the second external electrode, a third pad coupled to the third external electrode and a fourth pad coupled to the fourth external electrode, wherein at least one coupling conductor line that couples the third pad to the first pad or couples the fourth pad to the second pad is formed in the mounting surface of the circuit board, and wherein the first and second pads are directly coupled to the external circuit, and the third or fourth pads coupled to the coupling conductor line are coupled to an external circuit through the first or second pads coupled to the coupling conductor line.

43. The circuit board apparatus of claim 42, wherein the at least one coupling conductor line includes a first coupling conductor line for coupling the third pad to the first pad, and a second coupling conductor line for coupling the fourth pad to the second pad.

44. The circuit board apparatus of claim 43, wherein the first and second pads are directly coupled to the external circuit, and the third and fourth pads are coupled to the external circuit through the first and second pads.

45. The circuit board apparatus of claim 42, wherein the vias coupled to the first and second pads are formed as parts of the external circuit in the inner part of the circuit board.

46. The circuit board apparatus of claim 45, wherein the vias coupled to the first pad are disposed so that the vias are adjacent to the second pad, and the vias coupled to the second pad are disposed so that the vias are adjacent to the first pad.

47. The circuit board apparatus of claim 45, wherein two or more vias are coupled respectively to the first and second pads.

* * * * *